(12) United States Patent  
Kajiyama et al.

(10) Patent No.: US 7,848,177 B2  
(45) Date of Patent: Dec. 7, 2010

(54) SEMICONDUCTOR INTEGRATED CIRCUIT DEVICE

(75) Inventors: Shinya Kajiyama, Kodaira (JP); Yutaka Shinagawa, Sayama (JP); Makoto Mizuno, Tokyo (JP); Hideo Kasai, Kokubunji (JP); Takao Watanabe, Fuchu (JP); Riichiro Takemura, Los Angeles, CA (US); Tomonori Sekiguchi, Tama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 213 days.

(21) Appl. No.: 12/269,098

(22) Filed: Nov. 12, 2008

(65) Prior Publication Data

US 2009/0129173 A1    May 21, 2009

(30) Foreign Application Priority Data

Nov. 16, 2007   (JP)   ............................. 2007-297479

(51) Int. Cl.  
*G11C 8/00* (2006.01)

(52) U.S. Cl. .............................. 365/230.08; 365/230.01; 365/230.06; 365/230.09; 365/189.05; 365/189.04

(58) Field of Classification Search ............ 365/230.08, 365/230.01, 230.02, 230.06, 230.09, 189.05, 365/207, 196, 189.04, 189.011, 189.14, 189.16  
See application file for complete search history.

(56) References Cited

U.S. PATENT DOCUMENTS

| 5,210,863 | A | 5/1993 | Tomita |
| 5,375,089 | A | 12/1994 | Lo |
| 6,246,634 | B1 | 6/2001 | Nojima |
| 6,552,954 | B2 * | 4/2003 | Fujisawa et al. ......... 365/233.1 |
| 2004/0202020 | A1 | 10/2004 | Fujito et al. |
| 2006/0171239 | A1 | 8/2006 | Balasubramanian et al. |

FOREIGN PATENT DOCUMENTS

| EP | 0 562 605 A2 | 9/1993 |
| JP | 2001-306307 A | 11/2001 |
| JP | 2004-318941 A | 11/2004 |

* cited by examiner

*Primary Examiner*—Thong Q Le  
(74) *Attorney, Agent, or Firm*—Miles & Stockbridge P.C.

(57) ABSTRACT

The semiconductor integrated circuit device includes: a first latch which can hold an output signal of the X decoder and transfer the signal to the word driver in a post stage subsequent to the X decoder; a second latch which can hold an output signal of the Y decoder and transfer the signal to the column multiplexer in the post stage subsequent to the Y decoder; and a third latch which can hold an output signal of the sense amplifier and transfer the signal to the output buffer in the post stage subsequent to the sense amplifier. The structure makes it possible to pipeline-control a series of processes for reading data stored in the non-volatile semiconductor memory, and enables low-latency access even with access requests from CPUs conflicting.

16 Claims, 17 Drawing Sheets

SEMICONDUCTOR INTEGRATED CIRCUIT DEVICE

CLAIM OF PRIORITY

The Present application claims priority from Japanese application JP 2007-297479 filed on Nov. 16, 2007, the content of which is hereby incorporated by reference into this application.

DESCRIPTION OF THE RELATED ART

Field of the Invention

The present invention relates to a semiconductor integrated circuit including a non-volatile semiconductor memory accessible for CPUs (Central Processing Units), and more particularly a technique useful e.g. in application to a multi processor system.

BACKGROUND OF THE INVENTION

In The fields of system LSIs and microcontrollers, the introduction of a multi-core structure that a plurality of CPUs are implemented in a chip has been progressing for the purpose of simultaneously achieving the suppression of increase in power consumption stemming from the rise in the frequency of clocks, and the enhancement of the performance. In parallel with such trend, in design of system LSIs, we are pressed with the urgent need to select to provide a memory devoted solely to each CPU or to arrange two or more CPUs to share a common memory.

In a distributed memory system that a dedicated memory is provided for each CPU, and the CPU is connected with memory through a low-latency bus, the CPUs run different programs. Therefore, memory access and data transfer on the low-latency bus never conflict with each other. On this account, distributed memory systems have an advantage that programs high in parallelism can be run with a low latency. However, in a distributed memory system, a program and data, which are handled by the whole LSI, are distributed and stored in individual memories. Therefore, it is considered that the finite memory capacity cannot be leveraged effectively, and an unused memory region tends to arise.

In contrast, as for shared memory system that a memory is shared by CPUs, it is conceivable that one memory region can be used effectively, however the conflict between accesses by CPUs to the shared memory, and the conflict of data transfer on a bus tend to occur. Therefore, the increase in the latency in connection with data transfer inside a chip can cause the degradation of performance.

On this account, as supposed in JP-A-2001-306307, it is required for a shared memory system to reduce the latency resulting from the conflicts in connection with memory access and bus use while effectively leveraging a memory region.

Now, as to a multi processor system, during execution of a system setup initial diagnosis in accordance with an initial diagnosis program (hereinafter referred to as "firmware" or its abbreviation "FW"), CPUs on two or more modules read a diagnosis program on a non-volatile memory common to the CPUs, which is a diagnosis module, concurrently, and thus the system performance is deteriorated.

In accordance with JP-A-2001-306307, to reduce the conflicts in connection with memory access and a bus shared in the system during execution of FW, a FROM (slave non-volatile ROM) is placed on each processor module, and the FW has been saved in FROM in each processor module in advance. These means make smaller the logical and physical distances between each CPU and the diagnosis program, thereby lowering the latency owing to an initial diagnosis process and shortening the time of system setup. Therein, a program which has been checked about the coherency of FW per se is used as a master program, and FW on FROM in each processor module and FW on FROM in the diagnosis module are checked against each other before execution of FW on FROM in each processor module. Specifically, before execution of diagnosis, FW on FROM in the diagnosis module SVP is compared in version with FW on FROM in each processor module. Then, a non-volatile memory with FW of a newer version stored therein is disposed as a master ROM in an address space. The process of making such comparison of version and decision can be performed by just comparing data of at most several bytes. Therefore, it is possible to reduce the number of instruction fetches through a diagnosis path which latens the speed of access.

Thus, in case that the coherency of FW on FROM in each processor module is not checked, an additional process of updating FW is required, whereas in case that the coherency is checked, the diagnoses of CPU and cache memory can be performed, in parallel, with low latency without using a system shared bus and a diagnosis path.

However, in cases of multi core microcontrollers, the application of non-volatile memories is not limited to only such initial diagnoses. As for multi core microcontrollers with shared memories, a user program and data for control are stored in an on-chip non-volatile memory, which are to be read by CPUs. Basic processes during the time of running a user program are instruction fetch from a non-volatile memory, instruction decode and instruction execution by each CPU. Further, depending on the type of an instruction, read from a non-volatile memory into a register in CPU is conducted frequently. For this reason, in regard to not only the system setup, but also read of a non-volatile semiconductor memory as a normal operation, it is required to lower the latency.

On top of that, microcontrollers are required to achieve high performance, high reliability and a low cost. In the field of microcontrollers, it is not advisable in chip area and cost to arrange a non-volatile memory exclusively for each CPU in addition to a shared non-volatile semiconductor memory which CPUs can read as in JP-A-2001-306307. What is essential to achieve a high performance and a low cost in regard to microcontrollers simultaneously is a technique to materialize non-volatile semiconductor memories which can be read with low latency even with read requests from CPUs conflicting in spite of adopting the shared memory system.

In general are often adopted means such as disposing a cache memory with a low latency between a non-volatile semiconductor memory and CPUs, and using a hierarchical memory to lower the latency. However, in fields that high reliability is required particularly, such as the field of automotive control, it is required to ensure not only peak performances, but also performances in nearly worst cases including a case of a low cache hit ratio. From these points, it is an essential matter to lower the latency of a non-volatile semiconductor memory per se.

Therefore, it is an object of the invention to provide a technique for materializing a low latency access even in case of occurrence of conflict between access requests from CPUs.

The above and other objects and novel features of the invention will be apparent from the description hereof and the accompanying drawings.

SUMMARY OF THE INVENTION

Of embodiments herein disclosed, the preferred ones will be described below in brief.

In a post stage subsequent to the X decoder, a first latch which can hold an output signal of the X decoder and transfer the signal to the word driver is disposed. In the post stage subsequent to the Y decoder, a second latch which can hold an output signal of the Y decoder and transfer the signal to the column multiplexer is disposed. In the post stage subsequent to the sense amplifier, a third latch which can hold an output signal of the sense amplifier and transfer the signal to the output buffer is disposed. The structure as stated above makes it possible to pipeline-control a series of processes for reading data stored in the non-volatile semiconductor memory. In addition, it enables low-latency access even with access requests from CPUs conflicting.

The effect which the preferred ones of embodiments herein disclosed provide is as follows in brief.

Low latency access can be materialized even with access requests from CPUs conflicting.

DETAILED DESCRIPTION OF THE PREFERRED EMBODIMENTS

Preferred Embodiments

The preferred embodiments herein disclosed will be outlined first. Here, the reference numerals, characters or signs for reference to the drawings, which are accompanied with paired round brackets, only exemplify what the concepts of components referred to by the numerals, characters or signs contain.

[1] A semiconductor integrated circuit device (10) in accordance with a preferred embodiment of the invention includes a non-volatile semiconductor memory (100), which a first CPU (CPU0) and a second CPU (CPU1) different from the first CPU can access. The non-volatile semiconductor memory includes: a plurality of word lines (WL); a plurality of bit lines (BL) laid out to intersect the plurality of word lines; and a plurality of non-volatile memory cells (MC) connected to the plurality of word and bit lines, and each operable to store data. Also, the non-volatile semiconductor memory includes: an X decoder (121) for decoding an X address signal transferred from the first or second CPU to form a word line select signal for selecting one of the plurality of word lines; and a word driver (106) for driving, based on the word line select signal from the X decoder, the corresponding word line to a select level. Further, The non-volatile semiconductor memory includes: a Y decoder (122) for decoding a Y address signal transferred from the first or second CPU to form a bit line select signal for selecting one of the plurality of bit lines; a sense amplifier (108) for amplifying a signal output from the memory cell to the bit line; a column multiplexer (107) operable to selectively connect, based on the bit line select signal from the Y decoder, the corresponding bit line to the sense amplifier; and a output buffer (111, 112) for outputting an output signal of the sense amplifier to the first or second CPU. In a post stage subsequent to the X decoder is disposed a first latch (104) operable to hold an output signal of the X decoder, and then transfer the signal to the word driver. In a post stage subsequent to the Y decoder is disposed a second latch (105) operable to hold an output signal of the Y decoder and then transfer the signal to the column multiplexer. In a post stage subsequent to the sense amplifier is disposed a third latch (110) operable to hold an output signal of the sense amplifier and then transfer the signal to the output buffer.

The structure as described above makes it possible to pipeline-control a series of processes for reading data stored in the non-volatile semiconductor memory. This enables low-latency access even with access requests from CPUs conflicting.

[2] An X address signal contained in an address signal transferred from the first or second CPU is decoded into a word line select signal by the X decoder. Then, the first latch latches the word line select signal. The word driver drives the word line into the select level in accordance with the word line select signal latched by the first latch.

[3] A Y address signal contained in an address signal transferred from the first or second CPU is decoded into a bit line select signal by the Y decoder. Then, the second latch latches the bit line select signal. The column multiplexer selectively connects, in accordance with the bit line select signal, the corresponding bit line with the sense amplifier.

[4] A signal output from the non-volatile memory cell to the bit line is amplified by the sense amplifier. Then, the third latch latches an output signal of the sense amplifier. The latched signal is output through the output buffer to the first or second CPU.

[5] An X address signal contained in an address signal transferred from the first CPU is decoded into a word line select signal by the X decoder. Then, the first latch latches the word line select signal. Subsequently, the word driver drives the word line in accordance with the latched signal. In parallel with driving the word line, the X decoder decodes an X address signal contained in an address signal transferred from the second CPU.

[6] A Y address signal contained in an address signal transferred from the first CPU is decoded into a bit line select signal by the Y decoder. Then, the second latch latches the bit line select signal. Subsequently, the column multiplexer selectively connects, in accordance with the bit line select signal, the corresponding bit line with the sense amplifier. In parallel with connecting the bit line with the sense amplifier, a Y address signal contained in an address signal transferred from the second CPU is decoded by the Y decoder.

[7] Data read in accordance with a result of decode of an address signal transferred from the first CPU is latched by the third latch, and then output from the output buffer to the first CPU. In parallel with the data output, a result of decode of an address signal transferred from the second CPU is latched, followed by driving the word line, connecting the bit line with the sense amplifier, and amplifying a signal by use of the sense amplifier.

[8] In the non-volatile semiconductor memory, the following may be provided: a first port which allows an address signal from the first CPU to be latched; a first address latch (101) capable of holding the address signal latched through the first port; a second port which allows an address signal from the second CPU to be latched; a second address latch (102) capable of holding the address signal latched through the second port; and a control circuit (131) operable to form a control signal for beginning decode of the address signal held by the second address latch after completion of decode of the address signal held by the first address latch.

[9] The non-volatile semiconductor memory includes a control circuit (131) for forming control signals for latching a result of decode of an address signal transferred from the second CPU, driving the word line, connecting the bit line with the sense amplifier, and using the sense amplifier to amplify a signal, in parallel with data output from the output buffer to the first CPU after the third latch latches data read in accordance with a result of decode of an address signal transferred from the first CPU.

[10] The first and second CPUs, and the non-volatile semiconductor memory can be formed on a single semiconductor substrate.

[11] Between the first and second CPUs and the non-volatile semiconductor memory, a shared address bus (CABUS) shared by the first and second CPUs, and an arbiter (801) for arbitrating the right of the first CPU to use the shared address bus, the right of the second CPU to use the shared address bus, and conflict may be provided.

[12] Between the first and second CPUs and the non-volatile semiconductor memory, the following may be provided a shared address bus (CABUS) shared by the first and second CPUs and triggered by rising and falling edges of the bus clock signal, and an address multiplexer (1001) for multiplexing address signals output from the first and second CPUs with a frequency identical to a frequency of the bus clock into multiplex signals, and then sending the multiplex signals to the non-volatile semiconductor memory through the shared address bus.

[13] A first data bus (DBUS0) for transferring data read out of the non-volatile semiconductor memory to the first CPU, and a second bus (DBUS1) for transferring data read out of the non-volatile semiconductor memory to the second CPU are provided, whereby data transfer from the non-volatile semiconductor memory to the first CPU and data transfer from the non-volatile semiconductor memory to the second CPU can be performed in parallel.

[14] A first buffer memory (303) operable to sequentially latch and store data output from the non-volatile semiconductor memory, and output the data to the first CPU in order in which the data are latched may be disposed between the non-volatile semiconductor memory and first CPU. A second buffer memory (304) operable to sequentially latch data output from the non-volatile semiconductor memory, and output the data to the second CPU in the order in which the data are latched may be disposed between the non-volatile semiconductor memory and second CPU.

[15] A data bus (CDBUS) shared by the first and second CPUs, and a buffer memory (1007) operable to sequentially latch data output through the bus from the non-volatile semiconductor memory, and output the data to the first and second CPUs within a single bus clock in order in which the data are latched may be provided.

[16] The plurality of non-volatile memory cells (MC) include a film stack (ONO) composed of silicon oxide, silicon nitride, and silicon oxide disposed between the substrate and memory gate between a semiconductor substrate (SUB) and a memory gate (MG).

DETAILS OF THE PREFERRED EMBODIMENTS

Now, the embodiments will be further detailed.

First Embodiment

Figure 18:
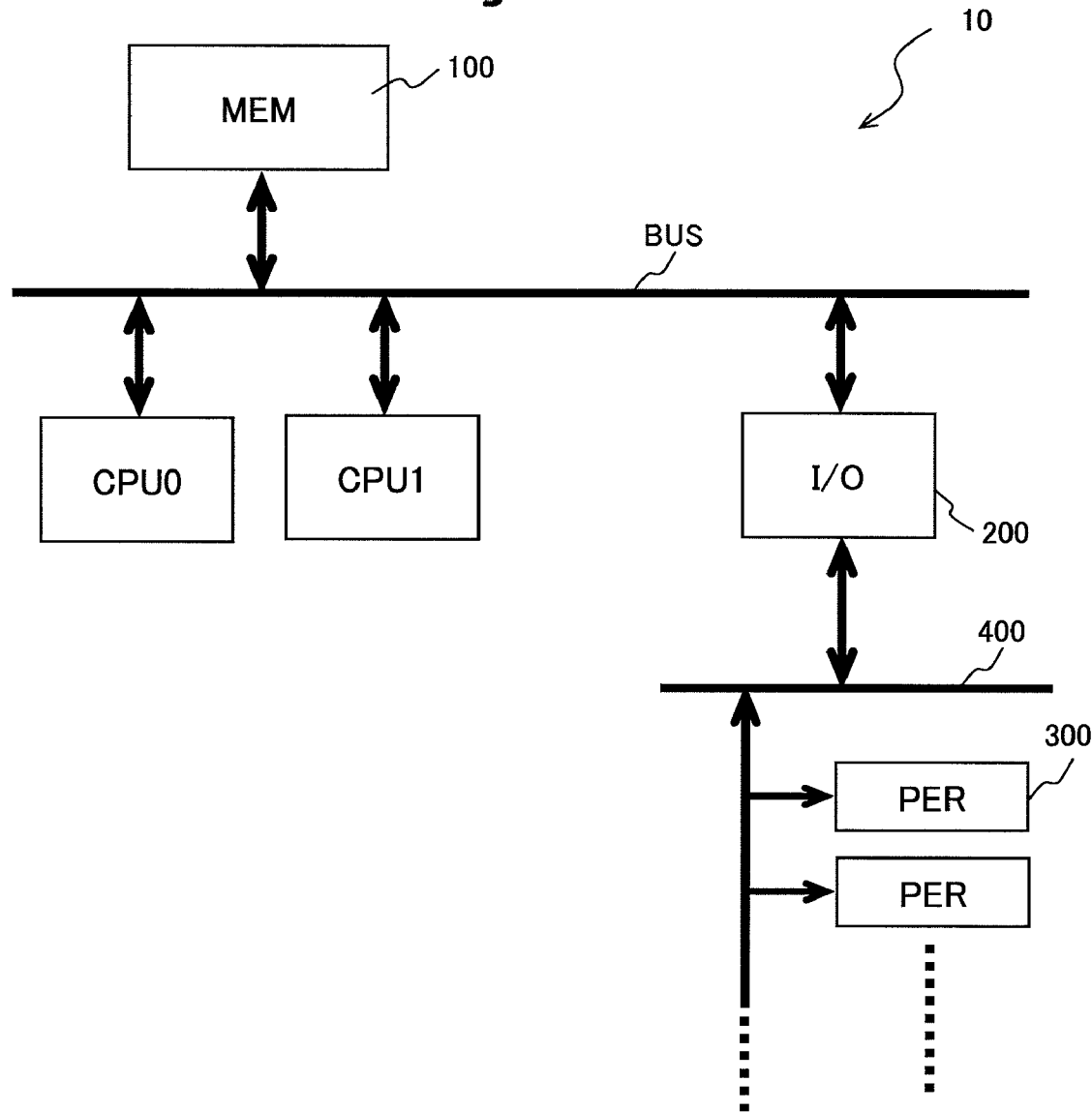
FIG. 18 is a block diagram showing an example of the general structure of the multi processor system.

FIG. 18 shows a multi processor system, as an example of a semiconductor integrated circuit device in accordance with the invention.

Although no special restriction is intended, the multi processor system 10 shown in FIG. 18 is formed on a single semiconductor substrate, such as single crystal silicon substrate, by the well-known techniques of manufacturing semiconductor integrated circuits.

The multi processor system 10 shown in FIG. 18 has processors CPU0 and CPU1, an input/output (I/O) circuit 200 and a non-volatile semiconductor memory (MEM) 100 connected by a system bus BUS so that they can exchange signal with one another. However, no special restriction is intended with respect to this. The input/output circuit 200 is connected to two or more peripheral circuits (PER) 300 through a local bus 400. The peripheral circuits 300 include an A/D converter for converting an input analog signal into a digital signal, and a timer for measuring time. The non-volatile semiconductor memory 100 is shared by the processors CPU0 and CPU1, which can access the memory randomly.

Figure 1:
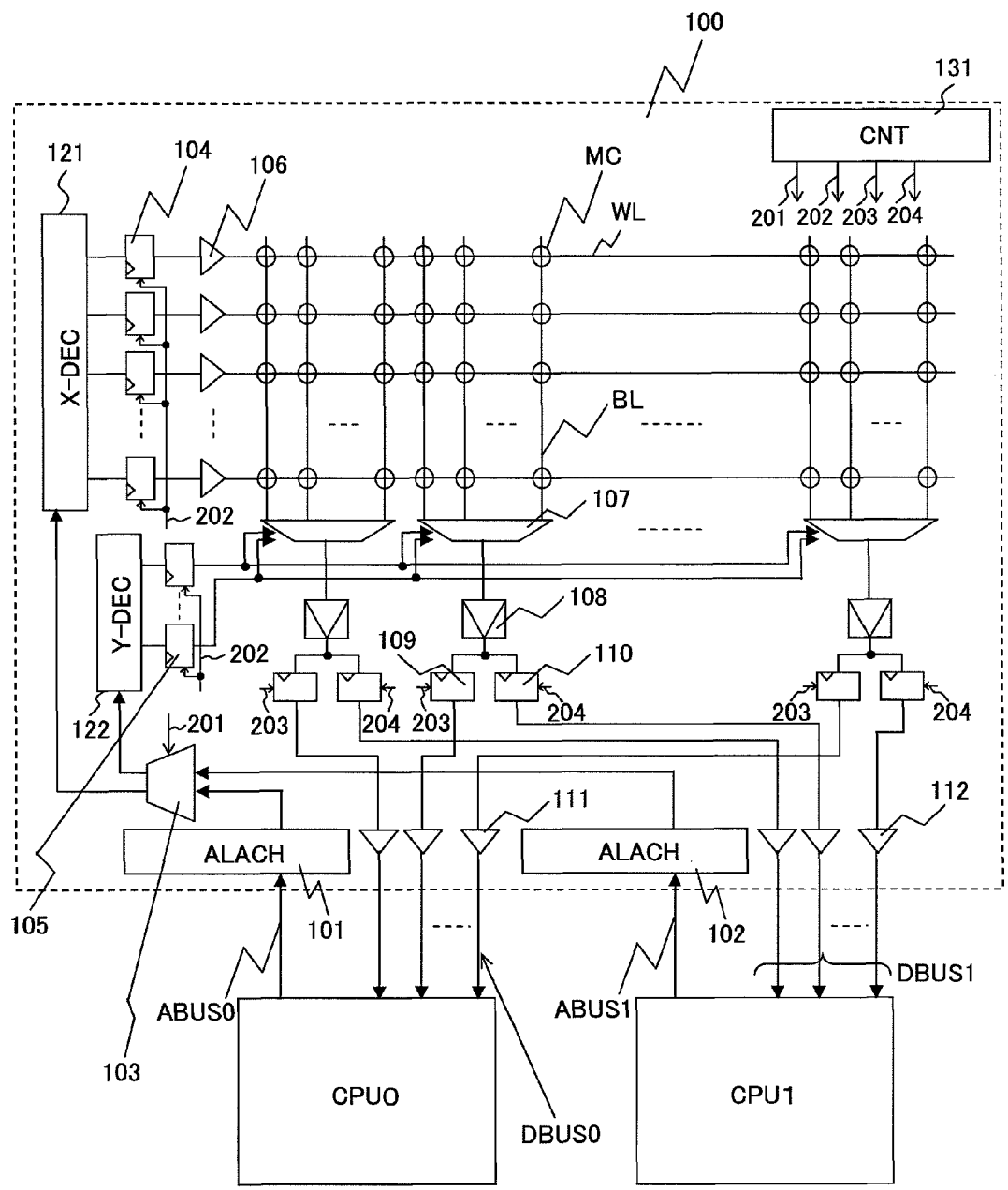
FIG. 1 is a block diagram showing an example of the structure of an important portion in a multi processor system as an example a semiconductor integrated circuit device in accordance with the invention.

FIG. 1 shows an example of the structure of the non-volatile semiconductor memory 100.

Although no special restriction is intended, in this example, the non-volatile semiconductor memory 100 is a NONOS type flash memory, which has a dual port. The dual port has sets of address and data buses; each exclusively for the corresponding one of the processors CPU0 and CPU1. In other words, the non-volatile semiconductor memory 100 has a set of ports PORT0 and PORT1; the port PORT0 is connected to the processor CPU0 through the address bus ABUS0 and data bus DBUS0, and the port PORT1 is connected to the processor CPU1 through the address bus ABUS1 and data bus DBUS1. Such structure eliminates the need for an arbiter for performing arbitration at the time of occurrence of bus conflict, and the need for changing a circuit of a single-core CPU structure. Further, in this example, the following are performed in accordance with the pipeline control: address decode; power supply to a selected word line WL; connection between a selected bit line and a sense amplifier; data sensing; and data output. Further, to realize pipeline operations, a latch is placed in each of an address path and a data path.

Further, in the non-volatile semiconductor memory 100, an address latch (ALACH) 101 operable to hold an address signal from the processor CPU0, and an address latch (ALACH) 102 operable to hold an address signal from the processor CPU1 are provided. An address multiplexer 103 behind the address latches 101 and 102 selectively transfers output signals from the address latches 101 and 102 to a circuit in its subsequent stage.

Word lines WL and bit lines BL are laid out so as to intersect one another; a memory cell MC is located at each intersection. The memory cell MC is a non-volatile memory cell as described later in detail. The memory cell MC is connected with the word line WL and bit line BL, and enables storage of a program and data. Also, in the non-volatile semiconductor memory 100, an X decoder (X-DEC) 121 for decoding a row address signal is provided. In the subsequent stage of the X decoder 121, a group of X decode latches 104 operable to hold a result of decode by the X decoder 121 are disposed. In a stage subsequent to the group of X decode latches 104, a word driver 106 is disposed corresponding to each X decode latch 104. The word driver 106 drives the word line WL to a select level. Also, in the non-volatile semiconductor memory 100, a Y decoder (Y-DEC) 122 for decoding a Y address signal is provided. In the subsequent stage of the Y decoder 122, a group of Y decode latches 105 operable to hold a result of decode by the Y decoder 122 are disposed. An output signal from each Y decode latch 105 is transferred to a column multiplexer (Y-MUX) 107 for selecting the bit lines BL. Based on the output signal of the Y decode latch 105, the selecting operation of the column multiplexer 107 is controlled. Further, in a stage subsequent to the column multiplexer 107, a sense amplifier 108 for sensing an output signal from the column multiplexer 107 is disposed. In a stage subsequent to the sense amplifier 108, a group of data latches 109 and 110 are disposed corresponding to the each sense amplifier 108. In the stage subsequent to each data latch 109, a bus driver (output buffer) 111 is disposed. An output signal form each data latch 109 is transferred to the processor CPU0 through the corresponding bus driver 111. Further, in the subsequent stage of each data latch 110, a bus driver 112 is disposed. An output signal from the data latch 110 is transferred to the processor CPU1 through the corresponding bus driver (output buffer) 112. Also, in the non-volatile semiconductor memory, a control circuit (CNT) 131 is provided. The control circuit 131 controls the operation of an important portion in the non-volatile semiconductor memory 100. For example, the control circuit 131 produces various kinds of control signals including an address multiplexer control signal 201, a trigger 202 for X and Y decode latches, a trigger 203 for data latch of the output side of the processor CPU0, and a trigger 204 for data latch of the output side of the processor CPU1. The selecting operation of the address multiplexer 103 is controlled by the address multiplexer control signal 201. The trigger 202 for X and Y decode latches is used to control the operations of the X decode latch 104 and Y decode latch 105. The trigger 203 for data latch of the output side of the processor CPU0 is used to control the operation of the data latch 109. The trigger 204 for data latch of the output side of the processor CPU1 is used to control the operation of the data latch 110.

In accordance with the arrangement as described above, X decode latches 104 are provided in the subsequent stage of the X decoder 121, and the Y decode latches 105 are disposed in the subsequent stage of the Y decoder 122, and the data latches 109 and 110 are disposed in the subsequent stage of each sense amplifier 108, which makes it possible to carry out a pipeline operation for data reading. Thus, even in case that conflict occurs between a read access from the processor CPU0 and a read access from the processor CPU1, the read latency can be kept below twice as high as in case of no conflict.

While FIG. 1 shows an example of the dual core structure having the processors CPU0 and CPU1, the number of such processors are not limited particularly. The latency in case of occurrence of conflict among read accesses by n CPUs can be kept n times that in case of no conflict or below by application of a multi core structure with n CPUs, which results from expansion of a dual core structure.

Figure 15:
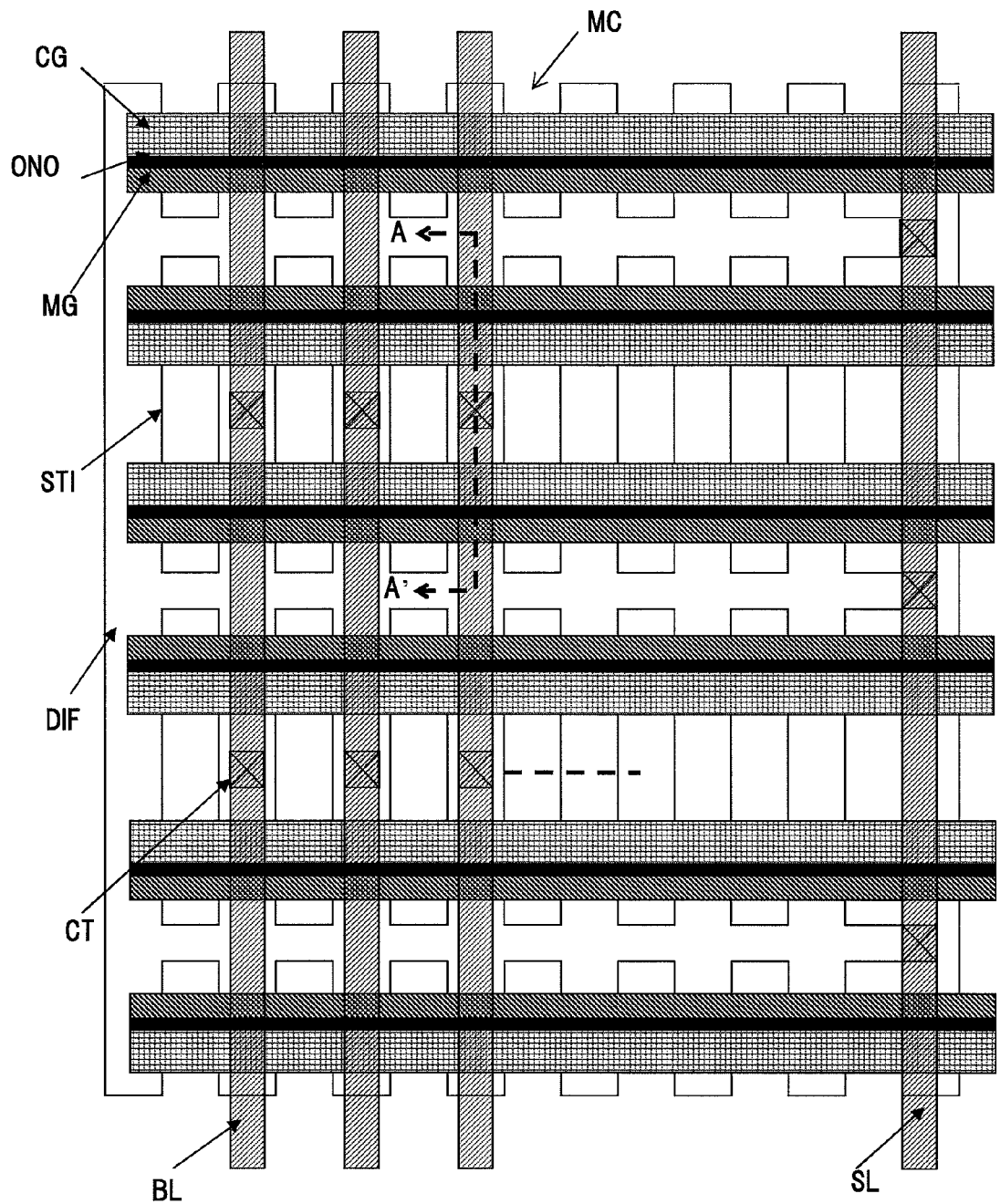
FIG. 15 is a plan view showing an example of the layout of an important portion of a non-volatile semiconductor memory included in the multi processor system.

FIG. 15 shows an example of the layout of the memory cells MC.

The memory cells MC have a split gate type memory cell structure with a memory gate MG and a control gate CG, each can be regarded as a cell constituted by a combination of a MG-MOS and a CG-MOS connected in series; MG-MOS has a gate composed of the memory gate MG, and CG-MOS has a gate composed of the control gate CG. Each control gate CG corresponds to the word line. At the time of reading, the CG-MOS is turned on by raising the voltage of the control gate CG, and a current depending on the threshold voltage Vth of MG-MOS is made to pass through the bit lines BL. While this is not shown in the drawing, data is read by a sense amplifier connected to each bit lines BL as follows. That is, the logic value of data is made "1" in case that a current passing through the bit line BL is larger than a set threshold current, i.e. the threshold (Vth) of the memory cell MC is lower; the logic value of data is made "0" in case that the current passing through the bit line BL is smaller than the threshold current, i.e. the threshold (Vth) of the memory cell is higher.

The drains of memory cells MC are paired in columns' direction i.e. a direction in parallel with the bit lines, and the drains of each pair share one contact CT and are connected through the contact CT to the corresponding bit line BL on a metal trace. The sources of the memory cells MC are connected through a diffusion layer DIF, which is connected through the contacts CT to source lines SL on the metal trace at intervals. In other words, formed is a parallel-connected NOR-type array that the memory cells MC arrayed in the columns' direction share the bit line BL, and all the memory cells share the source line SL.

Figure 16:
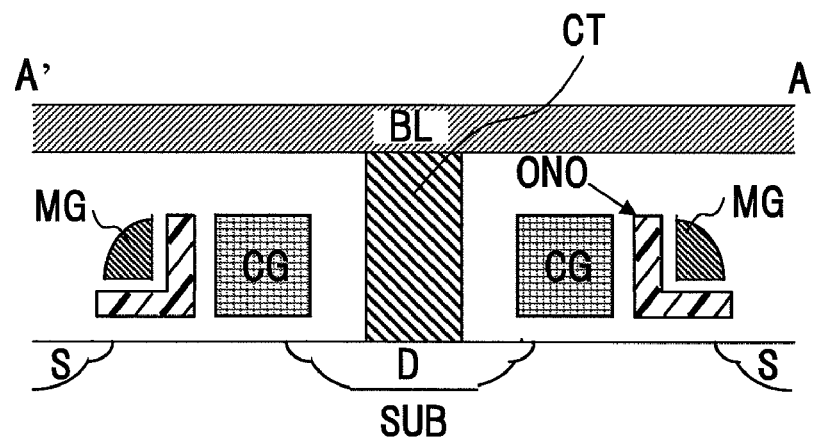
FIG. 16 is a cross sectional view of the memory cell taken along the line A-A' of FIG. 15)

FIG. 16 represents a cross sectional view of the memory cell MC (i.e. sectional view taken along the line A-A' of FIG. 15). After formation of a poly-silicon control gate CG on a semiconductor substrate SUB, a film stack consisting of silicon oxide, silicon nitride and silicon oxide (which is referred to as ONO film stack) is formed. Subsequently, a poly silicon memory gate MG is formed with ONO film stack left as a side wall. Thus, an ONO film stack can be formed under the memory gate MG. The silicon nitride film is an insulator having a trapping ability. Therefore, as in a poly silicon floating gate type flash memory, the threshold voltage (Vth) of MG-MOS is controlled by trapping charges, whereby data can be stored. After program and erase, charges are left trapped in the insulator film discretely. Therefore, an event that all of trapped charges are lost through defects in oxide film as in a floating gate type memory of low resistance is hard to occur, and such charge lost can be restricted only in the vicinities of defects. As a result, the oxide film can be thinned, and a relatively larger memory cell current in comparison to that in a floating gate type memory can be gained. Further, as a memory cell current can be cut off in regard to CG-MOS, although a parallel NOR-type array is adopted, the memory can operate without a hitch even in case that the threshold voltage of MG-MOS is lowered thereby to cause depletion thereof. Thus, a large memory cell current can be gained. The silicon oxide under the control gate CG can be thinned, and all of the word drivers 106, sense amplifiers 108 and other elements, which are involved in a read operation, can be constituted by thin oxide devices. As described above, the non-volatile semiconductor memory 100 can achieve a low-latency read because of its large memory cell current and read circuit using thin oxide devices.

Figure 17A:
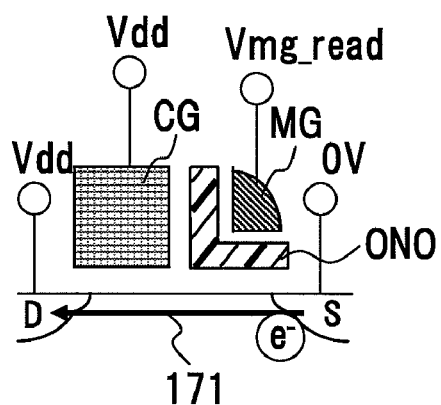
FIGS. 17A-17C are illustrations for explaining operations of reading, programming and erasing the non-volatile semiconductor memory.
Figure 17B:
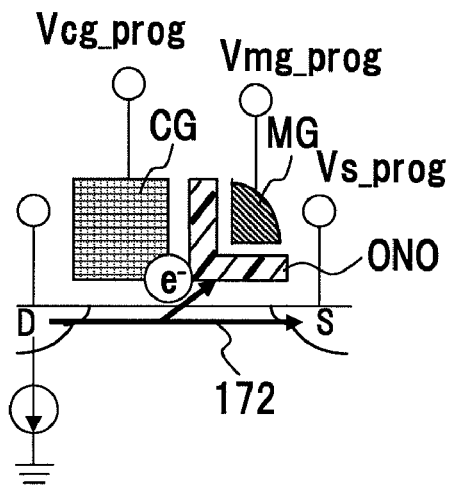
Figure 17C:
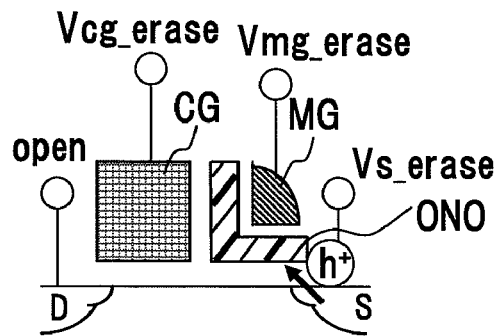

FIGS. 17A-17C show read, program and erase operations with respect to the memory cells MC.

As shown in FIG. 17A, in reading data from each memory cell MC, a high-potential-side source voltage Vdd is supplied to the drain D and control gate CG, and a predetermined voltage Vmg_read for read is supplied to the memory gate MG. At this time, the source is set to zero volt (ground level). In this condition, the read operation is performed by making a judgment on whether or not the current 171 traveling between the source S and drain D is equal to or larger than the threshold current.

As shown in FIG. 17B, the data programming to the memory cell MC is performed through a source side injection. The drain D is connected with a current source. Further, the control gate CG, memory gate MG and source S are supplied with predetermined voltages Vcg_prog, Vmg_prog, and Vs_prog for programming, respectively. At this time, current 172 flows between the source S and drain D. Electrons of the current 172 are accelerated by a lateral electric field between the source and drain thereby to generate hot electrons having high energy. The hot electrons which have gained an energy over the height of energy barrier of the oxide go through the silicon oxide with the aid of the vertical electric field brought by high-voltage memory gate MG, and are trapped in the silicon nitride, whereby the threshold voltage Vth with respect to the memory gate MG is raised. In this way, the data programming is performed.

Erasing data on the memory cell MC is performed through the band-to-band tunneling hot hole injection, as shown in FIG. 17C. Specifically, band-to-band tunneling is caused by applying a positive voltage Vs_erase to the source S and biasing the memory gate MG with a negative voltage Vmg_erase, whereby the resultant hot holes are injected into the silicon nitride. Thus, with no charge staying on the silicon nitride, a threshold lower than the initial threshold voltage can be achieved and in this condition, it becomes possible to erase data.

Now, the pipeline operation of the non-volatile semiconductor memory 100 will be described with reference to the timing chart of FIG. 2.

Into the non-volatile semiconductor memory 100 are latched address signals on the address busses ABUS0 and ABUS1, which are output by the processors CPU0 and CPU1, at a rising edge of a bus clock BCLK. In the non-volatile semiconductor memory 100, the following are performed: decoding the latched address signals, selecting the word line WL and bit line BL corresponding to the resultant addresses, supplying a voltage to the selected word line, and connecting the selected bit line BL with the corresponding sense amplifier 108. The sense amplifier 108 reads data from the selected memory cell MC. The data is output to the data bus DBUS0 or DBUS1. The data thus read is fetched by the processors CPU0 and CPU1 at a rising edge of the bus clock BCLK. The inside components of the processors CPU0 and CPU1 work in synchronization with the bus clock BCLK, and therefore the non-volatile semiconductor memory 100, and the processors CPU0 and CPU1 operate in synchronization with each other.

The processors CPU0 and CPU1 each have an independent program counter and a register. The processors CPU0 and CPU1 can make requests for read to the non-volatile semiconductor memory 100 in the same bus clock cycle. On receipt of simultaneous read requests, the non-volatile semiconductor memory 100 latches address signals from the processors CPU0 and CPU1, which have been triggered by the same bus clock rising edge, into the address latches 101 and 102.

Figure 2:
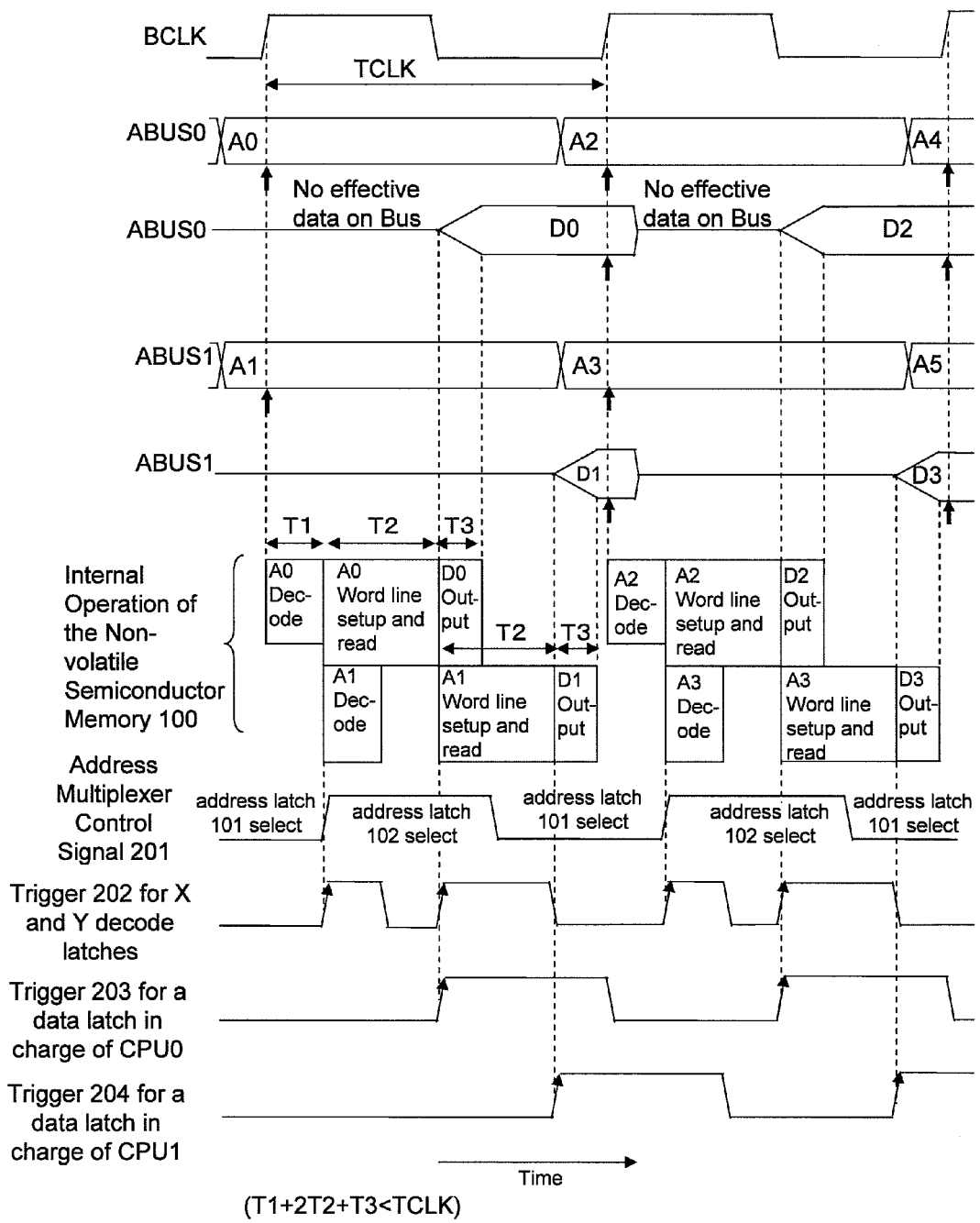
FIG. 2 is an operation timing chart in connection with the important portion of the structure shown in FIG. 1.

Now, as shown in FIG. 2, an address requested by the processor CPU0 is denoted by A0, and an address requested by the processor CPU1 is denoted by A1. The address multiplexer 103 placed in the subsequent stage of the address latches 101 and 102 first selects an output from the address latch 101, i.e. the address A0 from the processor CPU0, and sends the X and Y decoders 121 and 122 the address A0, or only bits of the address A0 respectively required for the X and Y decoders 121 and 122. The X and Y decoders 121 and 122 decode the address A0 to decide the selected word line WL and selected bit line BL.

Here, of X-decode time and Y-decode time, the longer time is referred to as "decode time". The decode time varies depending on the variations of power supply voltage, operation temperature and process. Therefore, a length of time resulting from addition of a margin to the decode time under the worst condition shall be herein denoted by T1 as shown in FIG. 2. In other words, the time T1 represents the worst delay time from the address latches 101 and 102 to the X decode latch 104 or Y decode latch 122 plus a margin.

At the time when the time T1 has elapsed from a rising edge of the bus clock BCLK, the address latch 102 is selected according to the address multiplexer control signal 201. Further, at the same timing, a trigger 202 for the X and Y decode latches 104 and 105 is asserted. Although no special restriction is intended, using the X and Y decode latches 104 and 105 each composed of an edge trigger type D-flip flop can ease the restriction in design of timing rather than using transparent latches. One of functions of these latches is to latch input data using a rising edge of the trigger signal to update their contents and outputs.

Just after elapse of the time T1, the word driver 106 supplies a voltage to the selected word line WL in accordance with the content of the X decode latch 104, and the column multiplexer 107 connect s between the selected bit line BL and sense amplifier 108 in accordance with the content of the Y decode latch 105. After that, the sense amplifier 108 makes a judgment on whether data is 0 or 1 from the voltage of the selected bit line BL. In parallel with these internal operations inside the memory array, decode of the requested address A1 is triggered by switching of the control signal 201 of the address multiplexer 103.

Now, a length of time resulting from addition of a margin to the worst time required to set up the selected word line WL, connect between the selected bit line BL and sense amplifier 108 in charge, and determine the data read by the sense amplifier 108 shall be herein denoted by T2 as shown in FIG. 2.

At the time when the time of T1+T2 elapses after the rising edge of the bus clock BCLK, a trigger 203 for a data latch 109 of the output side of the processor CPU0 is started, and data D0 stored at the address A0 is latched in the data latch 109. Although no special restriction is intended, the data latch 109 may be composed of a positive edge trigger type D-flip flop. At the same timing, the trigger 202 for the X and Y decode latches 104 and 105 is started, and the result of decode of the address A1 is output to the relevant word driver 106 and column multiplexer 107.

Just after elapse of the time T1+T2, the bus driver 111 begins driving a data bus, and the data D0 is output to the processor CPU0. In parallel, setup of the selected word line by the word driver 106 and connection between the selected bit line and relevant sense amplifier (108) are begun based on the result of decode of the address A1, whereby the sense amplifier reads data D1. Now, the worst delay time from the time when the data D0 left the data latch 109 to the time when the data D0 reaches the processor CPU0 through the bus driver 111 is herein denoted by T3.

At the time when the time T1+T2+T3 elapses after the rising edge of the bus clock BCLK, sending of the data D0 to the processor CPU0 is completed. On the other hand, at the time when the time T1+T2+T2 elapses after the rising edge of the bus clock BCLK, determination of the data D1 has been made. Therefore, the trigger 204 for the data latch 110 in charge of the processor CPU1 is started to latch the data D1. Although no special restriction is intended, the data latch 110 may be composed of a positive edge trigger type D-flip flop like the data latch 109. After that, the data D1 is output to the processor CPU1 through the bus driver 112. Specifically, at the time when the time "T1+T2+T2+T3" elapses after the rising edge of the bus clock, sending of the data D1 to the processor CPU1 is completed.

Now, it is noted that the timings of T1, T2, T3 can be created by a delay circuit on the basis of the bus clock BCLK. For example, in such case, two or more delay circuits are prepared, by which the bus clock is delayed. By making a logical product of the resultant signals or a result of another logical operation, pulses with any waveform can be materialized.

The example as described above can offer the following effects and advantages.

(1) Now, the cycle of clocks is herein denoted by TCLK. If the clock cycle can be designed so as to establish a condition of "T1+2T2+T3<TCLK", it becomes possible to concurrently accept read requests from two CPUs within 1TCLK and output data. Thus, data latch into the CPU can be performed 1TCLK behind a rising edge of the bus clock for latching an address. In case that no pipeline structure is built for read operations from a non-volatile semiconductor memory like this, it takes 1TCLK to read the data D0, and 1TCLK to read the data D1 even if the condition "T1+2T2+T3<TCLK" holds. Therefore, the read latency is 2 TCLKs for the processor CPU1. However, in case that such pipeline is arranged, a read latency of 1TCLK can be achieved for both the processors CPU0 and CPU1 as long as the clock cycle is designed so that the condition "T1+2T2+T3<TCLK" holds.

(2) The effect and advantage as described above enable enhancement in performance of a multi processor system.

(3) The non-volatile semiconductor memory 100 including MONOS type split gate memory cells MC can achieve low latency read because of its large memory cell current and read circuit using thin oxide devices. Such arrangement is useful for a memory cell and memory cell array, which can bring into reality a word line setup time and a sense-amplifier read time comparable to an address decode time and data bus propagation delay. From these points, the non-volatile semiconductor memory 100 including MONOS type split gate memory cells MC is preferable as a target to which the invention is applied.

Second Embodiment

Figure 3:
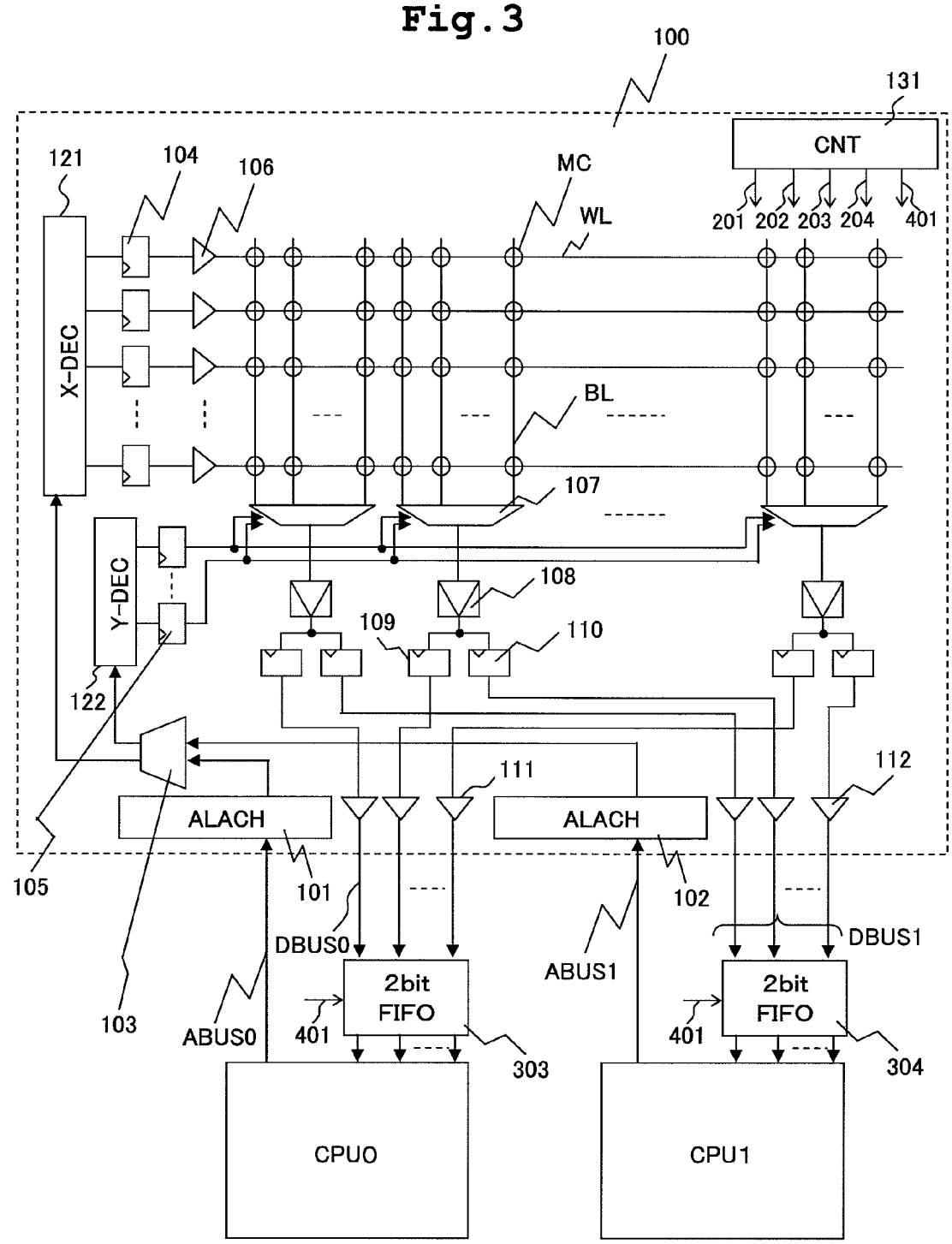
FIG. 3 is a block diagram showing an example of another arrangement of the important portion in the multi processor system.

FIG. 3 shows an example of another structure of the multi processor system 10. The non-volatile semiconductor memory 100 shown in FIG. 3 differs from that shown in FIG. 1 significantly in that first-in first-out buffers (2-bit FIFO) 303 and 304 which take a 2-bit structure of address bus ABUS and data bus DBUS are provided. The operations of the 2-bit FIFOs 303 and 304 are controlled in accordance with a 2-bit FIFO trigger signal 401 produced by the control circuit 131.

The first embodiment requires that the read from the non-volatile semiconductor memory should meet the following condition expressed using the clock cycle TCLK defined as shown in FIG. 2 and the time lengths T1 to T3: T1+2T2+T3<TCLK". However, the difference in speed between CPUs and memories tends to expand year by year in general. Therefore, it is difficult to meet the condition as described above except when a very high performance is not required and the CPUs' clocks are at most tens of megahertz.

Hence, in the structure as shown in FIG. 3, the restriction in the read latency of the non-volatile semiconductor memory 100 is eased.

Figure 4:
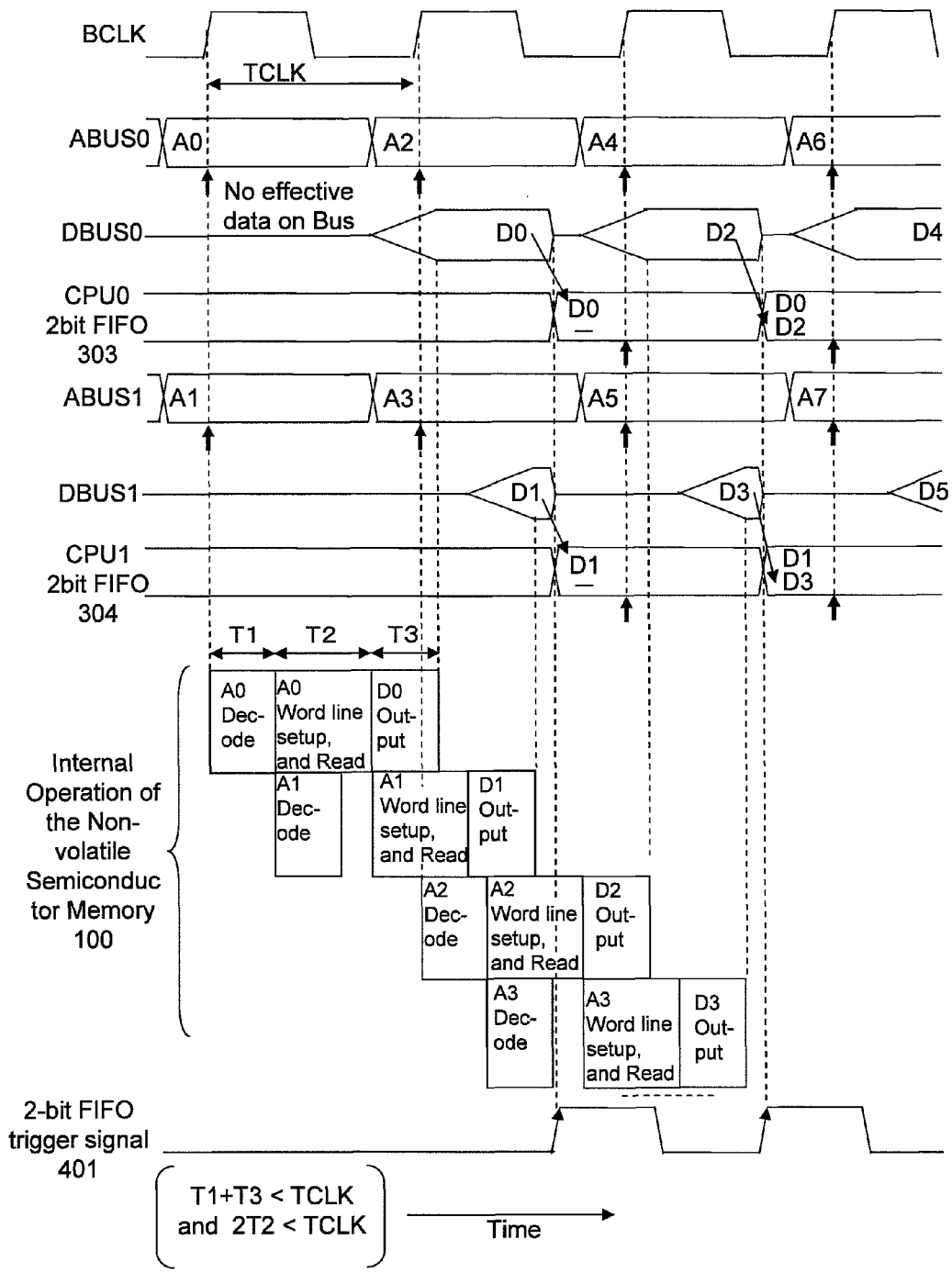
FIG. 4 is an operation timing chart in connection with the important portion of the structure shown in FIG. 3.

FIG. 4 presents an operation timing chart in connection with the structure as shown in FIG. 3. In this example, the following condition holds: 1TCLK<T1+T2+T3<2TCLK. As to the performance which the synchronous non-volatile semiconductor memory 100 has independently, the read latency is 2TCLK. Therefore, if no pipeline structure is constructed for a read operation in the non-volatile semiconductor memory 100, the read latency at the time of occurrence of conflict between read accesses from the processors CPU0 and CPU1 would be 4TCLK. Therefore, three stages pipelines for decode, select of the word line WL and read through it, and data output are herein built as shown in FIG. 4 to meet the condition "T1+2T2+T3<2TCLK". As a result, it becomes possible for both the processors CPU0 and CPU1 to read with a latency of 2TCLK.

At the second bus clock rising edge in FIG. 4, a read operation is performed based on the output of the data D0 and result of decode of the address A1. However, at this time, the decoders have already finished decode of the addresses A0 and A1, and therefore they can accept and begin decoding a subsequent address. At the second bus clock rising edge, the address A2 from the processor CPU0 and the address A3 from the processor CPU1 are latched in the address latch 301 and the address latch 302. After that, the pipeline operations are performed in the same way as in the case of the addresses A0 and A1.

In case that the word line setup and read in association with the address A1 are finished before termination of decode of the address A2, a useless waiting time, which would appear between decode of the address A2, and word line setup and read in association with the address A2, is eliminated. As a result, the read operations in connection with the addresses A2 and A3 are exactly the same as those for the addresses A0 and A1. Therefore, while the latency for each read is 2TCLK, it becomes possible to perform an operation of the same frequency as that of CPU, which includes successively accepting two addresses with the cycle of TCLK and outputting two pieces of data. The condition at this time is given by:

T1+2T2<TCLK+T1

∴ 2T2<TCLK.

Therefore, to meet the following condition becomes a requirement for accepting an address and then outputting data with the TCLK cycle:

T1+T3<TCLK, and

2T2<TCLK.

However, even with the above conditions satisfied, the data D2 has been already driven onto the data bus of the processor CPU0 at the time when the processor CPU0 attempts to fetch the data D0 at the third bus clock rising edge, as shown in FIG. 4. To prevent such overwrite, it is required that the processors CPU0 and CPU1 each have some buffer memory. Specifically, FIFOs 303 and 304 configured of two bits or larger as shown in FIG. 3 may suffice. For example, the 2-bit FIFOs 303 and 304 are provided with two rows of latches. Data from the non-volatile semiconductor memory 100 are written into the two rows of latches alternately. The data thus written are alternately output to the processors CPU0 and CPU1 in the order in which the data are written. The timing of write into the 2-bit FIFOs 303 and 304 may be after data output onto the data bus have reached an input portion of each FIFO and before subsequent data start activating the data buses. The 2-bit FIFO trigger signal 401 used for that is produced in the control circuit 131 so that the signal is asserted into its high level at the times as shown in FIG. 4. At this time, the control circuit 131 uses an appropriate delay circuit to delay a signal with respect to an edge of the bus clock BCLK, thereby to produce the trigger signal.

As described above, the read latency is 2TCLK because of the system layout that the 2-bit FIFOs 303 and 304 are placed in positions near the CPUs on the data buses as shown in FIG. 3, and the condition of "T1+T3<TCLK" and "2T2<TCLK" as shown in FIG. 4. However, even so, it is possible to ensure the same throughput as those achieved in accordance with the first embodiment described with reference to FIGS. 1 and 2.

Third Embodiment

Figure 5:
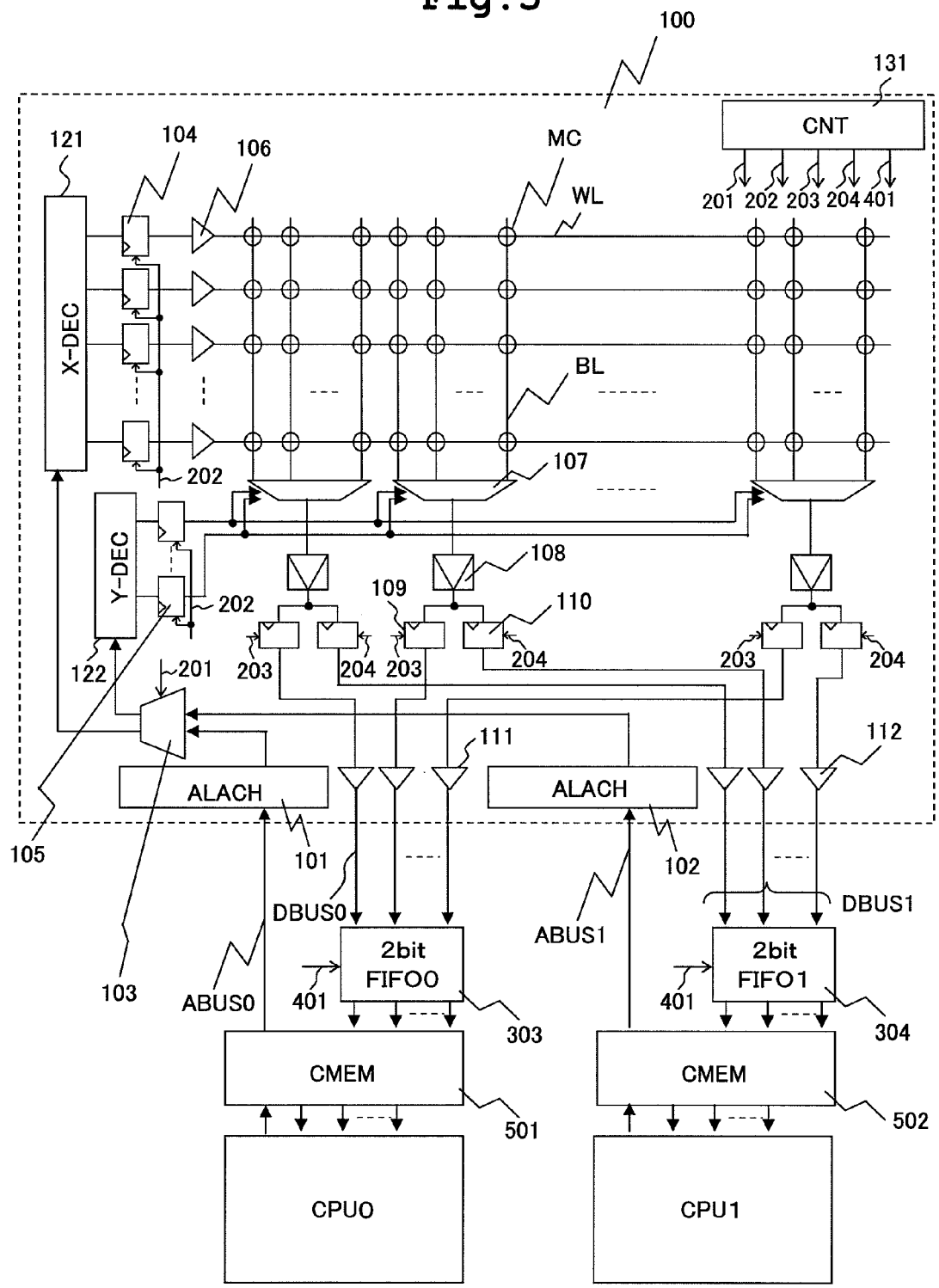
FIG. 5 is a block diagram showing an example of another structure of the important portion of the multi processor system.

FIG. 5 shows an example of another structure of the multi processor system 10.

The multi processor system shown in FIG. 5 differs from that shown in FIG. 3 in that the read latency is improved by cache memories (CMEM) 501 and 502 disposed between the processors CPU0 and CPU1 and the non-volatile semiconductor memory 100.

The multi processor system in accordance with the second embodiment offers a sufficient throughput because an address can be accepted to output data every clock cycle. However, in the multi processor system, the read latency is 2TCLK, which has the effect of reducing the latency at the time of occurrence of read conflict between two CPUs by half, however cannot shorten the read latency per read to 1TCLK.

Hence, low-latency cache memories 501 and 502 are placed between the processors CPU0 and CPU1 and the non-volatile semiconductor memory 100 as shown in FIG. 5. The cache memories 501 and 502 each offer a latency of 1TCLK and have a performance that execution of hit decision and read are enabled. Such cache memories 501 and 502 may be composed of static RAMs (Random Access Memory), or low-latency memories such as flip flops. However, no special restriction is intended in this respect.

The processors CPU0 and CPU1 output address signals to the cache memories 501 and 502, respectively. In the cache memories 501 and 502, detection is made based on tag data about whether or not data corresponding to the address signals sent from the processors CPU0 and CPU1 have been stored in their memories. If the cache memories 501 and 502 have the data corresponding the address signals therein, the result of the detection is a cache hit. Then, the cache memories 501 and 502 output the data corresponding to the address to the processors CPU0 and CPU1 respectively. If the cache memories 501 and 502 have no such data therein, the result of the detection is a cache miss. Then, the cache memories 501 and 502 pass the address signals to the non-volatile semiconductor memory 100 to read data, and perform output of the data to the processors CPU0 and CPU1, and write of the data into the cache memories 501 and 502.

As described above, the latency is 1TCLK at the time of cache hit, and 2TCLK at the time of cache miss, which corresponds to the read latency. The cache memories increase the footprint and cost of the chip. However, the cache memories have an advantage that the peak performance can be enhanced. The construction of a pipeline structure of read operations of the non-volatile semiconductor memory 100 exerts an effect in case that cache miss occurs, in regard to both the processors CPU0 and CPU1. The cache hit ratio depends on the configuration and capacities of cache memories, and a user program.

Fourth Embodiment

Figure 6:
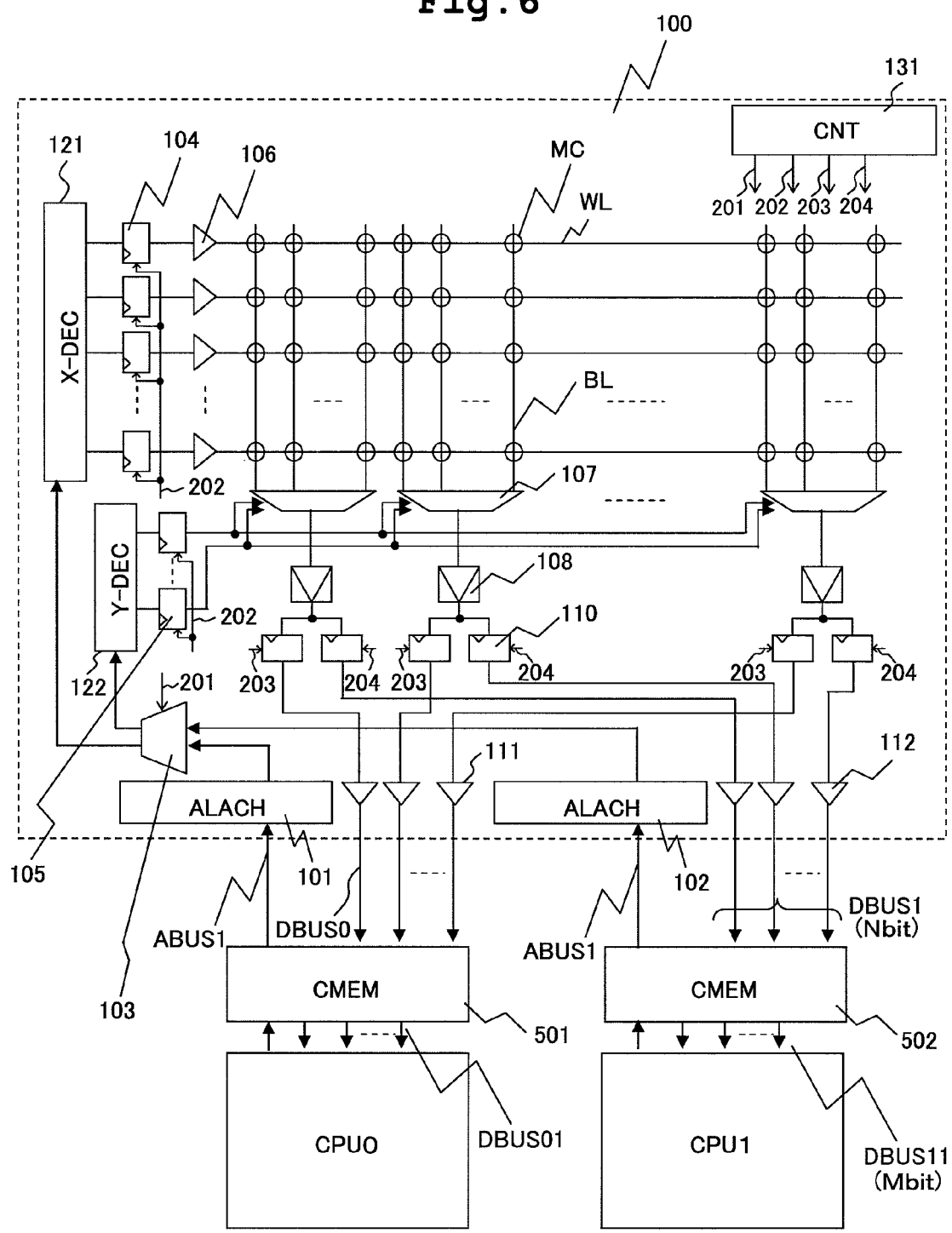
FIG. 6 is a block diagram showing an example of another structure of the important portion of the multi processor system.

FIG. 6 shows an example of another structure of the multi processor system 10.

The multi processor system 10 shown in FIG. 6 has cache memories 501 and 502 between the processors CPU0 and CPU1, and non-volatile semiconductor memory 100 respectively, as in the case of the third embodiment. The multi processor system 10 shown in FIG. 6 differs from that in accordance with the third embodiment shown in FIG. 5 in the following point. That is, sufficiently large widths of the data buses DBUS0 and DBUS1 between the non-volatile semiconductor memory 100 and the cache memories 501 and 502 are ensured to lower the probability of occurrence of successive cache misses, whereby the restriction on the speed of the non-volatile semiconductor memory 100 is eased without causing a large deterioration in performance in comparison to the system in accordance with the third embodiment.

As shown in FIG. 6, the width of the data buses DBUS0 and DBUS1 between the non-volatile semiconductor memory 100 and the cache memories 501 and 502 shall be N bits; the width of the data buses DBUS01 and DBUS11 between the cache memories 501 and 502 and the processors CPU0 and CPU1 shall be M bits. In case that N is sufficiently larger than M, a larger amount of data can be read from the non-volatile semiconductor memory 100, and written into the cache memories 501 and 502 by one read operation at the time of occurrence of cache miss. Therefore, it is expected that making N sufficiently larger than M can lower the probability of occurrence of successive cache misses as long as sufficiently large capacities of the cache memories 501 and 502 are ensured. In other words, in case that N is sufficiently larger, it is expected that the effect of performing acceptance of an address and data output every clock cycle at the second read and later as in the second embodiment of FIG. 4 is weakened. Therefore, the restriction on the speed of a read operation from the non-volatile semiconductor memory 100 can be eased by making N larger. N can be made larger by increasing the number of the sense amplifiers 108, decreasing inputs to the column multiplexer 107, and decreasing the number of bit lines per sense amplifier 108.

Figure 7:
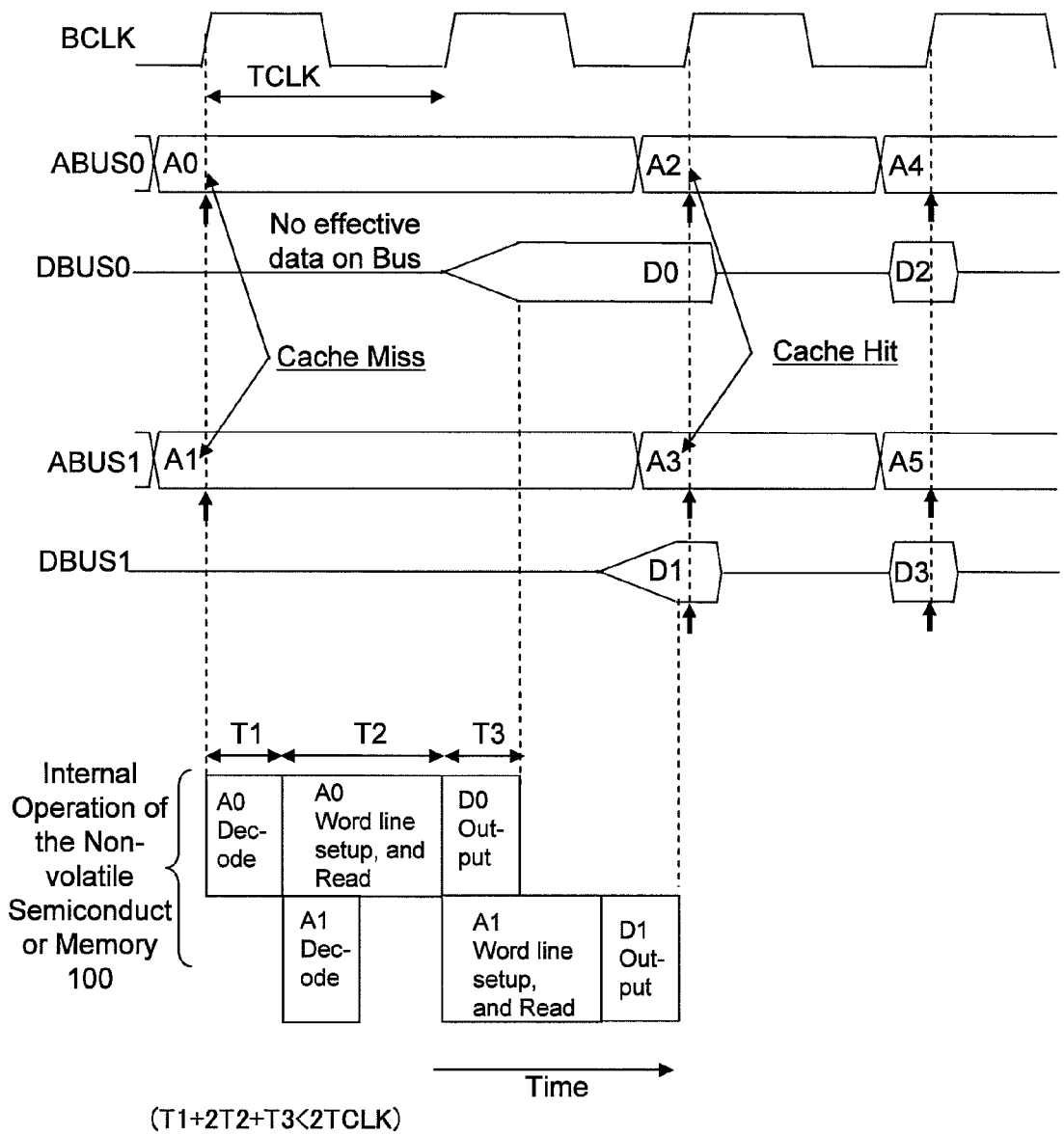
FIG. 7 is an operation timing chart in connection with the important portion of the structure shown in FIG. 6.

FIG. 7 shows the operation timing in connection with the multi processor system shown in FIG. 6. In the example shown in FIG. 7, the situations in the first to third bus clocks are as follows. In the first bus clock, both the processors CPU0 and CPU1 go into cache miss. Then, these reads are performed on the non-volatile semiconductor memory over 2TCLK. In the third bus clock, cache hits take place.

If cache miss occurs with the addresses A2 and A3 trailing the addresses A0 and A1, the outputs of the data D2 and D3 will be delayed by 1TCLK in comparison to the example of FIG. 7. However, as N is set to be sufficiently large, the probability of occurrence of such successive cache misses is small. Therefore, it is expected that making N sufficiently larger than M can ease the restriction on the speed of reading the non-volatile semiconductor memory 100, and the performance is not deteriorated to a larger extent in comparison to that achieved in accordance with the third embodiment.

The third embodiment differs from the second embodiment just in that cache memories 501 and 502 are added therein. Therefore, the condition making a restriction on the speed of reading the non-volatile semiconductor memory 100 in accordance with the third embodiment is "T1+2T2+T3<2TCLK" and "2T2<TCLK", which is the same as that in the second embodiment. However, in the fourth embodiment, such restriction can be eased to just "T1+2T2+T3<2TCLK". In addition, the overwrite of data on the data bus as cited in the description concerning the second embodiment does not occur. Therefore, the need for 2-bit FIFOs 303 and 304 as shown in FIGS. 3 and 5 is eliminated.

Fifth Embodiment

Figure 8:
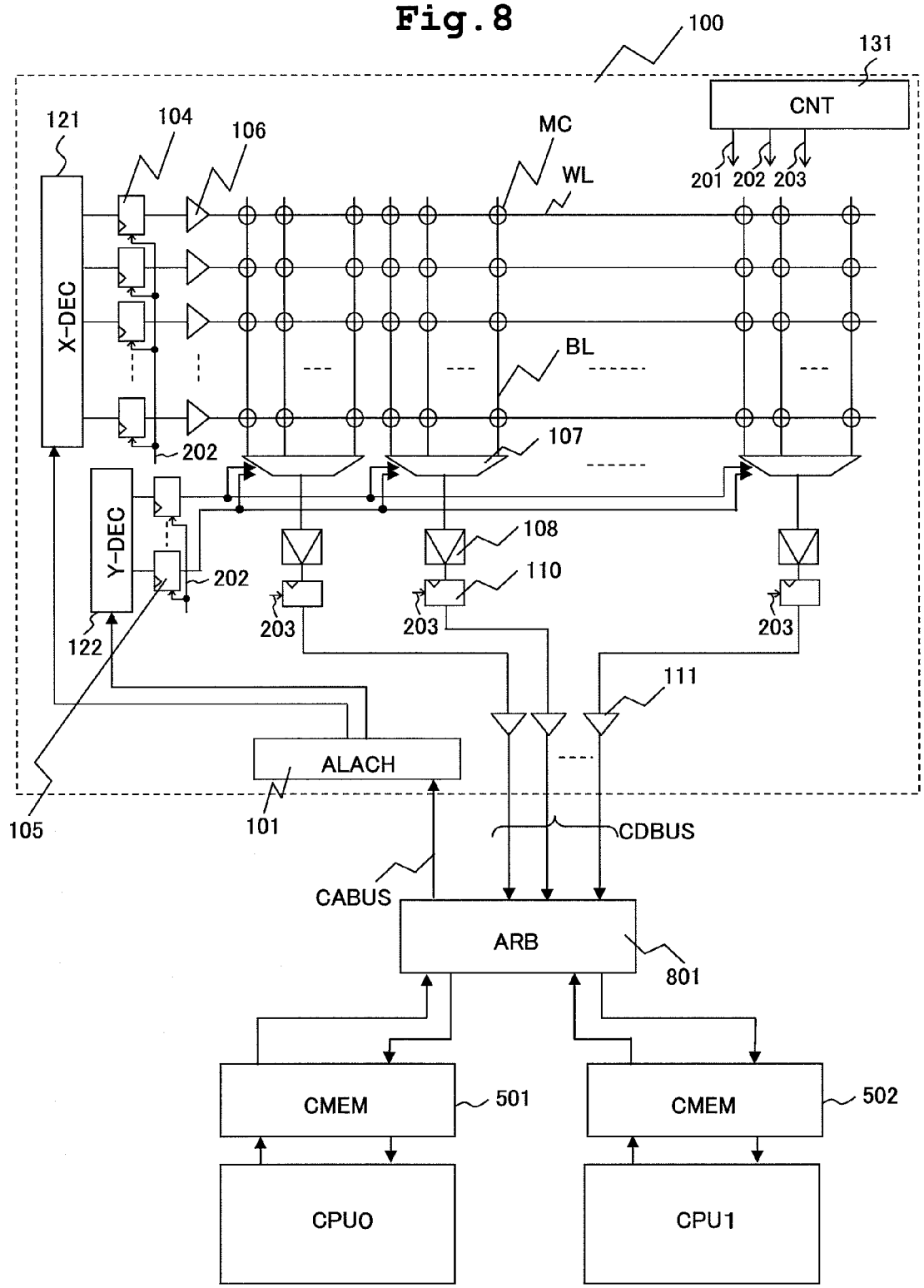
FIG. 8 is a block diagram showing an example of another structure of the important portion of the multi processor system.

FIG. 8 shows an example of another structure of the multi processor system 10.

In the example shown in FIG. 8, the address and data busses are decreased in number of lines, and the chip area is reduced. In the second to fourth embodiments, the processors CPU0 and CPU1 each have independent address and data buses. However, in the fifth embodiment, the address and data buses are shared by the processors CPU0 and CPU1, which makes it possible to reduce the number of these long bus lines and chip area. Specifically, a shared address bus CABUS, and a shared data bus CDBUS are provided instead, which are shared by the processors CPU0 and CPU1. In addition, a right of the processor CPU0 to use a bus and a right of the processor CPU1 to use a bus, and an arbiter (ARB) 801 for arbitration of conflict are provided.

In case that both the processors CPU0 and CPU1 go into cache miss, and concurrently issue read requests to the non-volatile semiconductor memory, the arbiter 801 provides the right to possess the shared address bus CABUS to one of the processors, and notifies the other processor that the shared address bus CABUS is busy.

Figure 9:
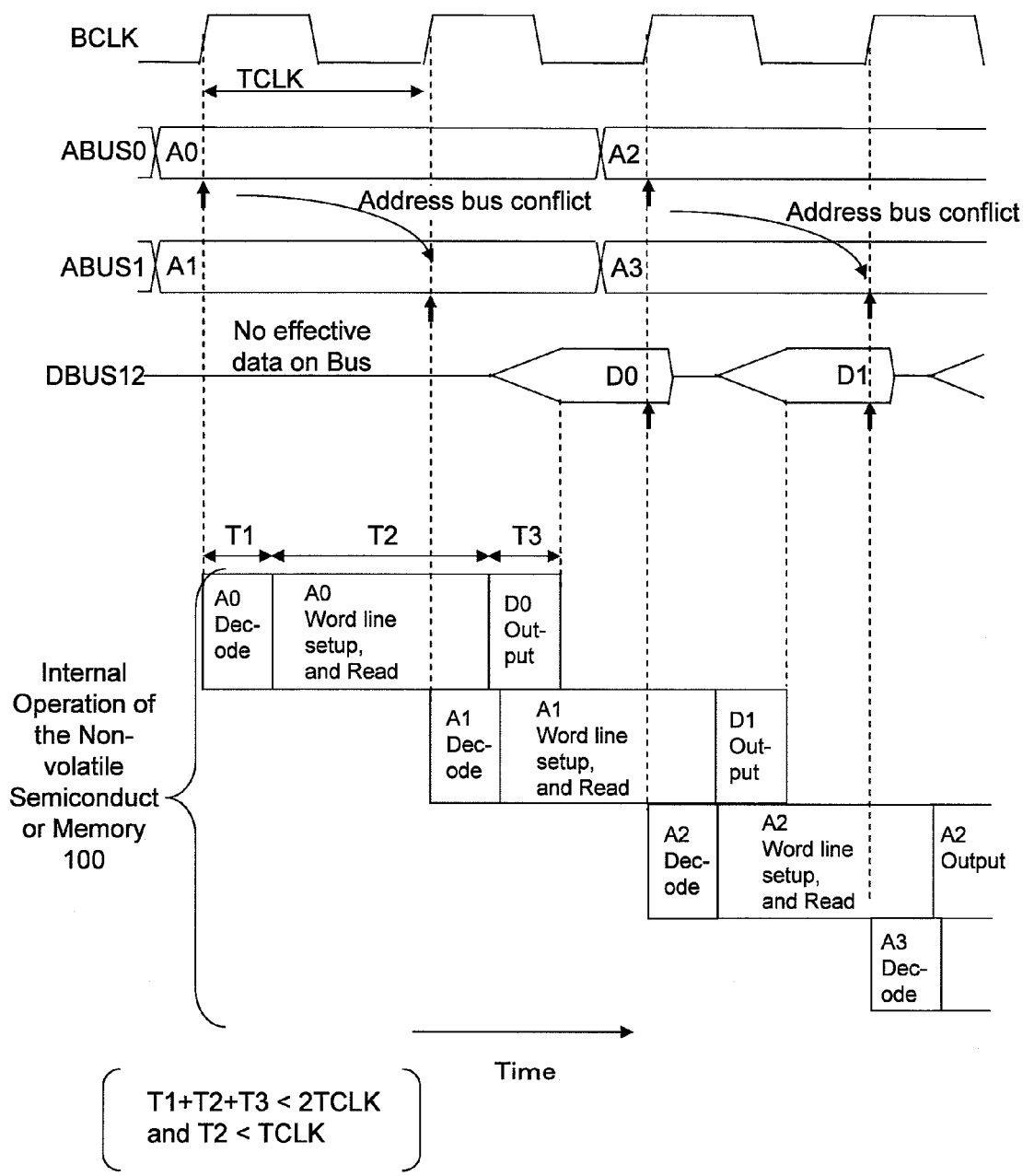
FIG. 9 is an operation timing chart in connection with the important portion of the structure shown in FIG. 8.

FIG. 9 shows the operation timing in connection with the multi processor system shown in FIG. 8.

Here, it is assumed that both the processors CPU0 and CPU1 go into cache miss, and concurrently issues read requests to the non-volatile semiconductor memory. This is not shown in the drawing, however the arbiter 801 provides the processor CPU0 with the right to use the address bus, and allows the processor CPU0 to send an address A0 to the non-volatile semiconductor memory. On the other hand, the arbiter 801 notifies the processor CPU1 that the shared address bus CABUS is busy, and it is required to wait for 1TCLK to elapse. The non-volatile semiconductor memory 100 undergoes read in connection with the address A0. Then, the non-volatile semiconductor memory 100 outputs data D0 to the processor CPU0 through the shared data bus CBUS and arbiter 801. The processor CPU0 acquires data D0 2TCLK behind the data read request in connection with the address A0 at the rising edge of the bus clock BCLK. The arbiter 801 sends an address A1 to the non-volatile semiconductor memory 100 1TCLK behind the data request in connection with the address A0 from the processor CPU0. Then, the non-volatile semiconductor memory 100 begins decoding the address A1 in parallel with reading data D0. 2TCLK behind the sending of the address A1 to the non-volatile semiconductor memory 100, i.e. 3TCLK behind the data read request in connection with the address A1, output of data D1 is completed. Based on address busy information at the time of issue of the data read request in connection with the address A1, it is expected that the data D1 be output after elapse of 3TCLK i.e. this 2TCLK plus 1TCLK for waiting for using the address bus, and the processor CPU1 can acquire this.

In the fifth embodiment, the read latency at the time of cache hit is 1TCLK. The latency at the time of cache miss is 2TCLK without the conflict of the shared address bus. In case that both the processors CPU0 and CPU1 go into cache miss and the conflict of the address bus occurs, the latency is 3TCLK for CPU which is made to wait for using the address bus. Now, the condition of the condition of FIG. 9 is "T1+T2+T3<2TCLK" and "T2<TCLK".

Sixth Embodiment

Figure 10:
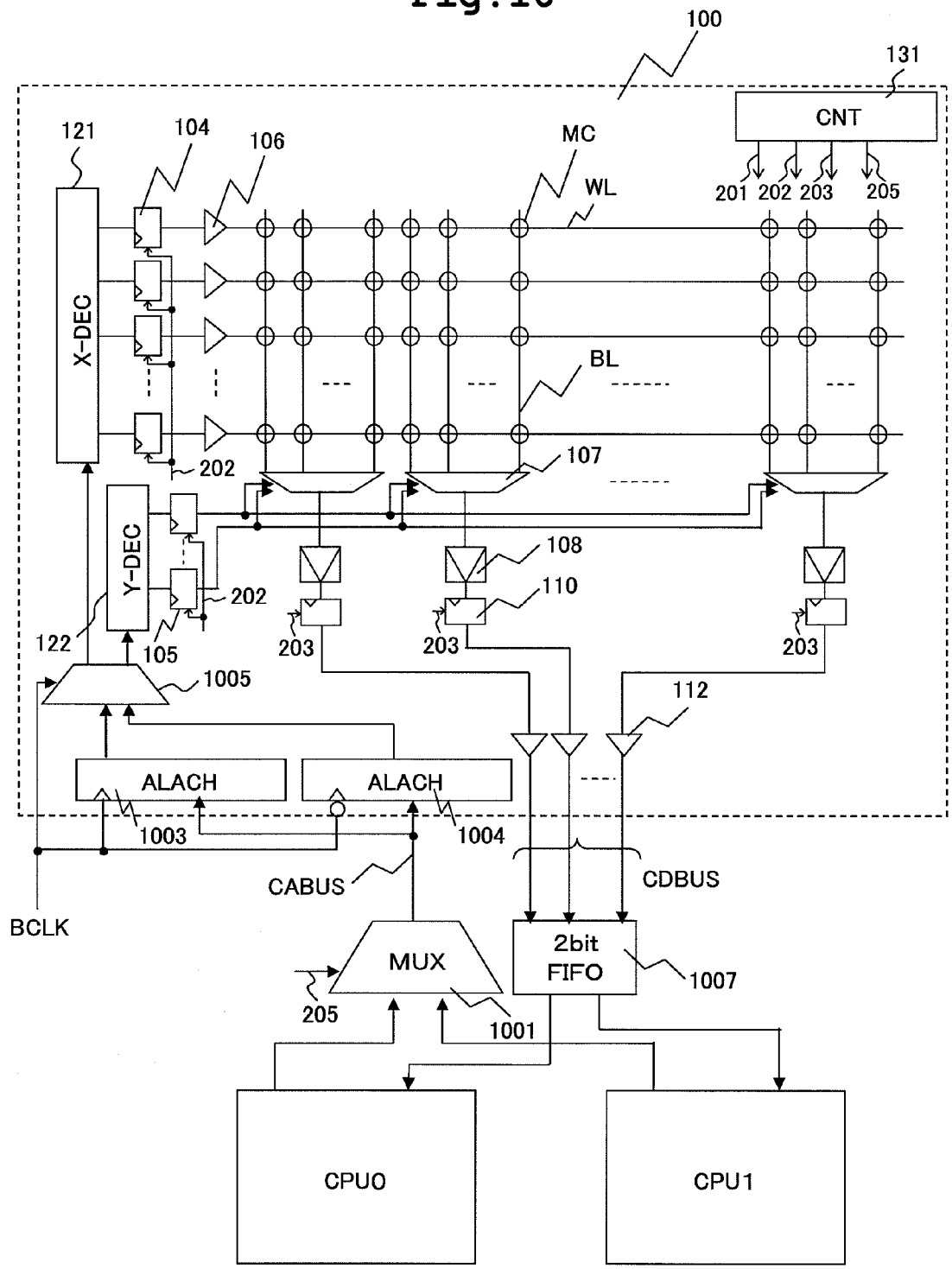
FIG. 10 is a block diagram showing an example of another structure of the important portion of the multi processor system.

FIG. 10 shows an example of another structure of the multi processor system 10.

In the embodiment of FIG. 10, shared address buses CABUS and CDBUS are shared by the processors CPU0 and CPU1. As a result, both rising and falling edges of the bus clock BCLK are used to send an address at double the transfer rate despite of reducing the area of wiring lines, whereby the read latency is shortened. Address signals from the processors CPU0 and CPU1 are selectively transferred to the non-volatile semiconductor memory 100 by the address multiplexer (MUX) 1001. Output data of the bus driver 112 are transferred to the processors CPU0 and CPU1 through the shared data bus CDBUS and 2-bit FIFO 1007. In addition, the non-volatile semiconductor memory 100 is provided with address latches (ALACH) 1003 and 1004, which are operated in synchronization with the bus clock BCLK, and an address multiplexer 1005. Address signals from the processors CPU0 and CPU1 are sent to the address multiplexer 1001, allocated to the address latches 1003 and 1004 by the address multiplexer, and then held by the address latches. The address signals stored in the address latches 1003 and 1004 are selectively transferred to the X decoder 121 and Y decoder 122 by the address multiplexer 1005.

Figure 11:
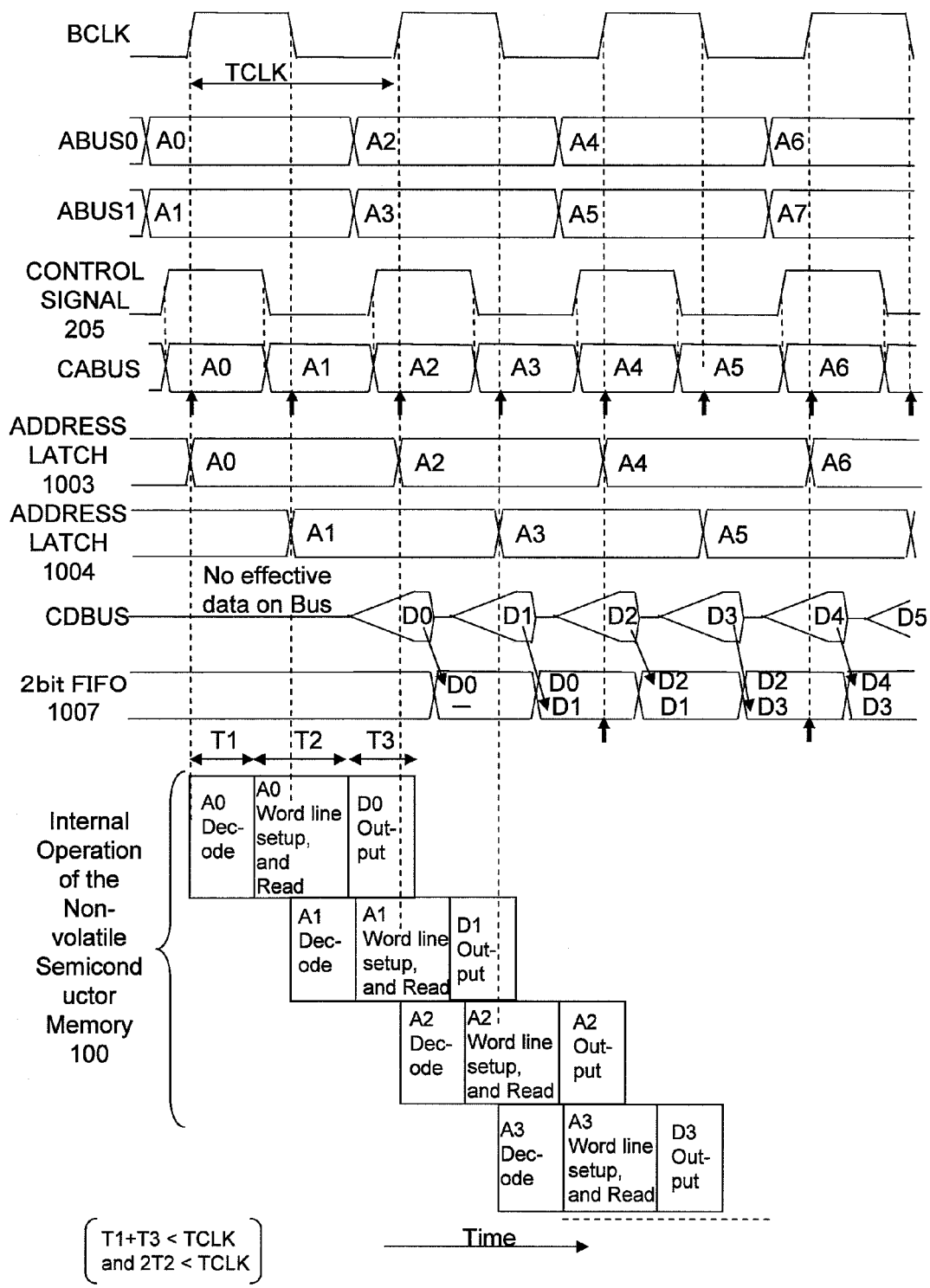
FIG. 11 is an operation timing chart in connection with the important portion of the structure shown in FIG. 10.

FIG. 11 shows the operation timing in connection with the multi processor system shown in FIG. 10.

Addresses output from the processors CPU0 and CPU1 are multiplexed by the address multiplexer 1001, and sent to the non-volatile semiconductor memory 100 through the shared address bus CABUS at double the transfer rate. The address multiplexer control signal 205 has the same frequency as that of the bus clock BCLK, which the control circuit 131 produces by delaying the bus clock. The address multiplexer 1001 selects an address in association with the processor CPU0 when the address multiplexer control signal 205 has a logical value "1". When the address multiplexer control signal 205 has a logical value "0", the address multiplexer selects an address in association with the processor CPU1. As for the timing, it is sufficient that an address coming from the processor CPU0 has reached the non-volatile semiconductor memory 100 at a rising edge of the bus clock BCLK when viewed from the non-volatile semiconductor memory 100, and an address coming from the processor CPU1 has reached the non-volatile semiconductor memory 100 at a falling edge. In the non-volatile semiconductor memory 100, an address latch 1003 operable to latch an address at a rising edge of the bus clock BCLK, and an address latch 1004 operable to latch an address at a falling edge thereof are provided. By making such arrangement, an address coming from the processor CPU0 is latched by the address latch 1003, and an address coming from the processor CPU1 is latched by the address latch 1004. The address multiplexer 1005, which is disposed in a stage subsequent to the address latches 1003 and 1004, is controlled using the bus clock BCLK. As a result, an address coming from the processor CPU0 and an address coming from the processor CPU1 are sent to the X and Y decoders 121 122 every half TCLK, and therefore it becomes possible to decode two addresses within 1TCLK.

As shown in FIG. 11, pipeline operations of lengths of T1, T2 and T3 are performed. An operation of the same frequency as that of CPU, such as successively accepting two addresses from the processors CPU0 and CPU1 with the cycle of TCLK and then outputting two pieces of data, can be performed as long as the condition "T1+T3<TCLK" and "2T2<TCLK" is satisfied. However, in case that CPU latches data at a rising edge of the bus clock, the latency of each read is 2TCLK. In addition, to prevent data on the data bus being overwritten before CPU latches the data at a time when 2TCLK has elapsed after CPU sent an address, an FIFO 1007 of two bits or larger is required as in the second and third embodiments.

Seventh Embodiment

Figure 12:
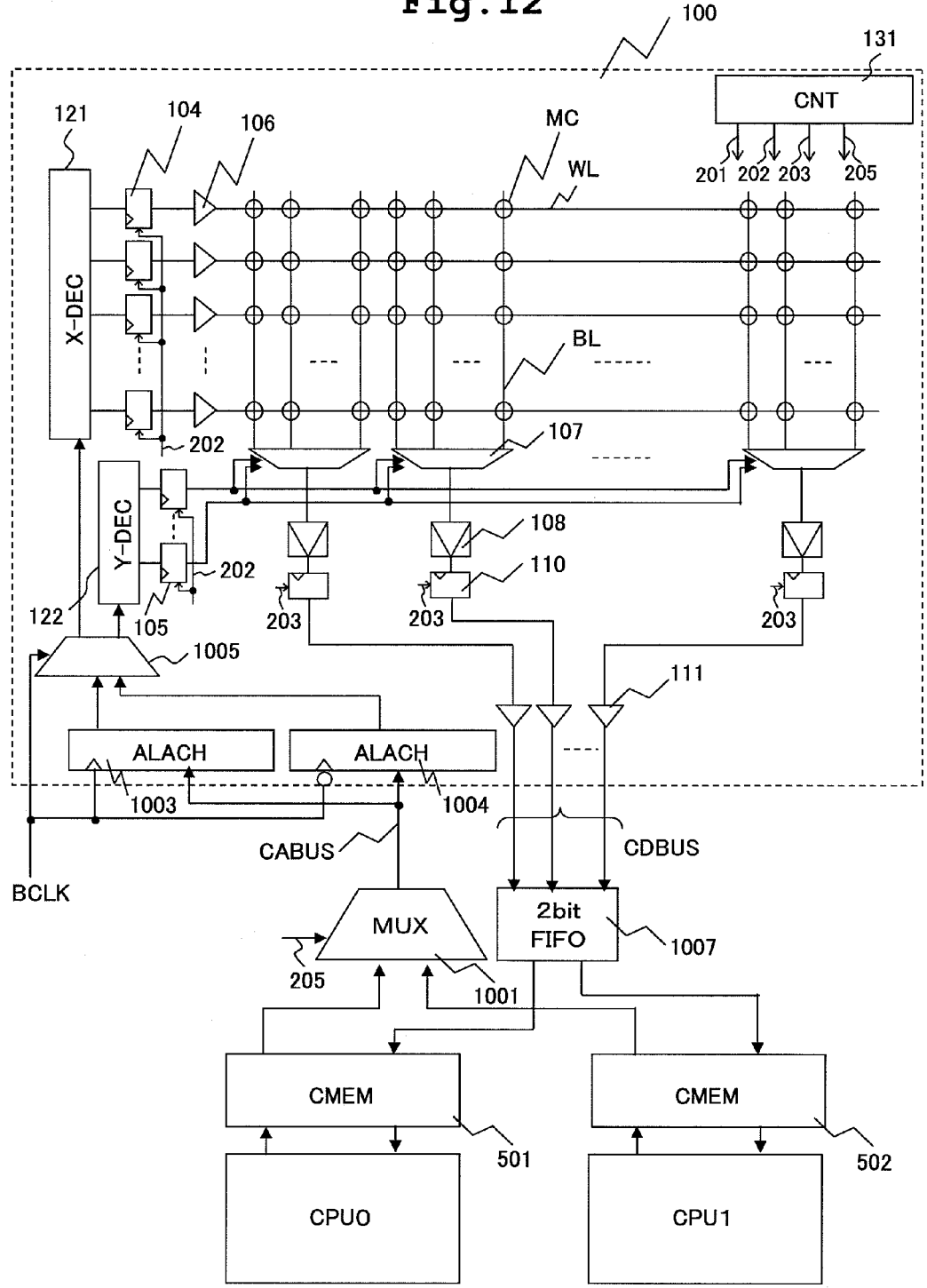
FIG. 12 is a block diagram showing an example of another structure of the important portion of the multi processor system.

FIG. 12 shows an example of another structure of the multi processor system 10.

The structure of the multi processor system shown in FIG. 12 differs from that of FIG. 10 in that cache memories (CMEM) 501 and 502 are provided between the processors CPU0 and CPU1 and the non-volatile semiconductor memory 100 respectively, whereby the read latency is improved. The sixth embodiment is sufficient in throughput because acceptance of an address and data output every clock cycle can be achieved. However, despite of the read latency of 2TCLK, and the effect of reducing by half the latency at the time of occurrence of the conflict of reads by two CPUs, it is impossible to shorten the latency to 1TCLK at one read.

Hence, as shown in FIG. 12, low-latency cache memories 501 and 502 are provided between the processors CPU0 and CPU1 and the non-volatile semiconductor memory 100. To enable allow hit detection and read with a latency of 1TCLK, the cache memories 501 and 502 are composed of low-latency memories, such as SRAMs and flip flops.

In accordance with the structure as described above, the read latency is 1TCLK at the time of cache hit, and 2TCLK at the time of cache miss. Therefore, this multi processor system is advantageous in that the peak performance is improved despite of the increase in chip area and the rise in cost owing to the addition of the cache memories.

The application of the pipeline control to an operation to read the non-volatile semiconductor memory 100 exerts an effect when both the processors CPU0 and CPU1 go into cache miss. The cache hit ratio depends on the configuration and capacities of cache memories, and a user program.

Eighth Embodiment

Figure 13:
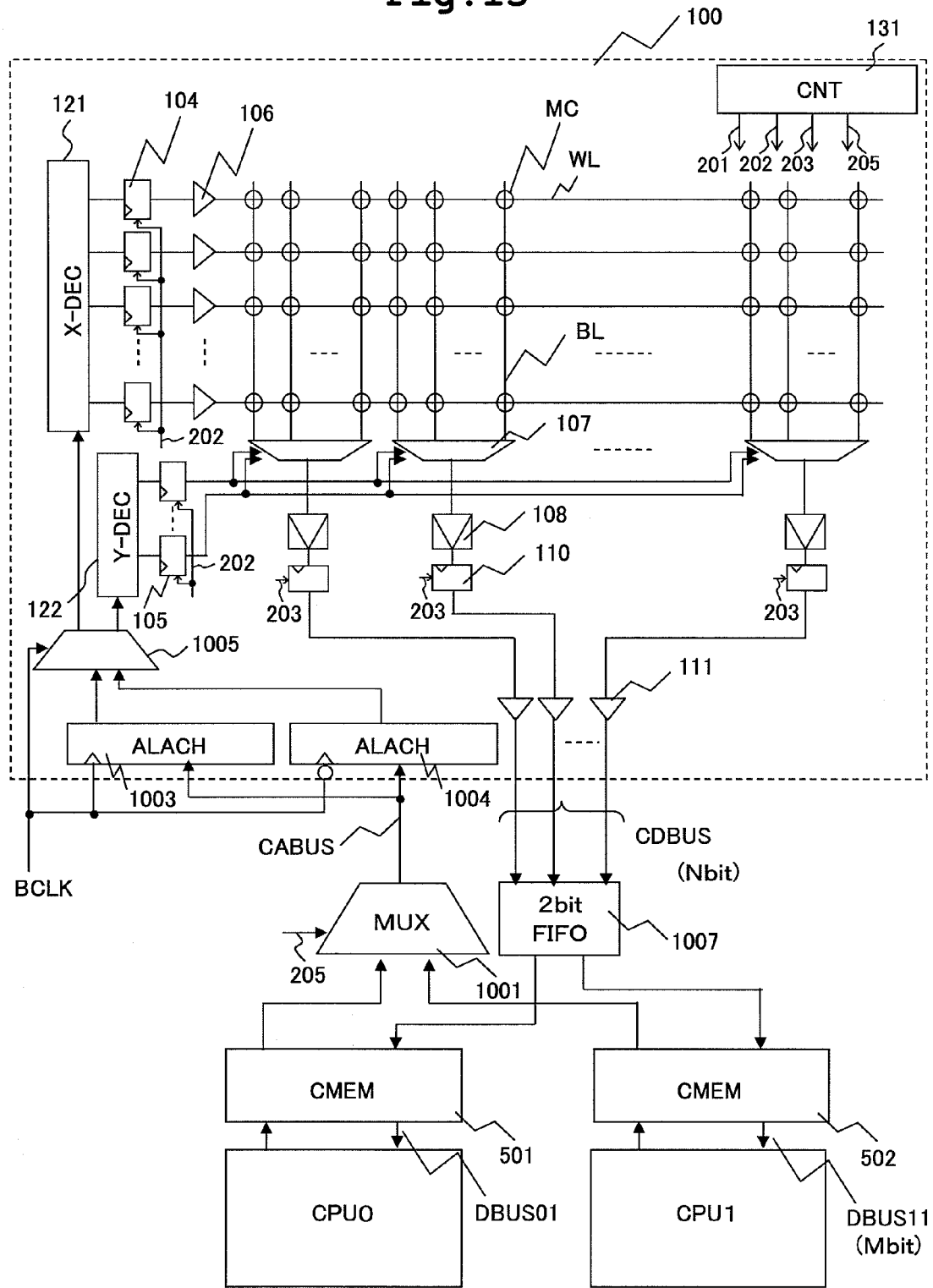
FIG. 13 is a block diagram showing an example of another structure of the important portion of the multi processor system.

FIG. 13 shows an example of another structure of the multi processor system 10.

In the structure shown in FIG. 13, cache memories 501 and 502 are provided between the processors CPU0 and CPU1 and the non-volatile semiconductor memory 100 respectively, as in the case of the seventh embodiment. The multi processor system 10 shown in FIG. 13 largely differs from that in accordance with the seventh embodiment in the following point. That is, the sufficiently large width of the shared data bus CDBUS between the non-volatile semiconductor memory 100 and the cache memories 501 and 502 is ensured to lower the probability of occurrence of successive cache misses, whereby the restriction on the speed of the non-volatile semiconductor memory 100 is eased without causing a large deterioration in performance in comparison to the system in accordance with the seventh embodiment.

In the structure as shown in FIG. 13, the width of the shared data buses CDBUS between the non-volatile semiconductor memory 100 and the cache memories 501 and 502 shall be N bits; the width of the data buses DBUS01 and DBUS11 between the cache memories 501 and 502, and the processors CPU0 and CPU1 shall be M bits. In case that N is sufficiently larger than M, a larger amount of data can be read from the non-volatile semiconductor memory 100, and written into the cache memories 501 and 502 by one read operation at the time of occurrence of cache miss. Therefore, it is expected that making N sufficiently larger than M can lower the probability of occurrence of successive cache misses as long as sufficiently large capacities of the cache memories 501 and 502 are ensured. In other words, in case that N is sufficiently larger, it is expected that the effect of performing acceptance of an address and data output every clock cycle at the second read and later as in the sixth embodiment of FIG. 11 is weakened. Therefore, the restriction on the speed of a read operation from the non-volatile semiconductor memory can be eased by making N larger. N can be made larger by increasing the number of the sense amplifiers, decreasing inputs to the column multiplexer, and decreasing the number of bit lines per sense amplifier.

Figure 14:
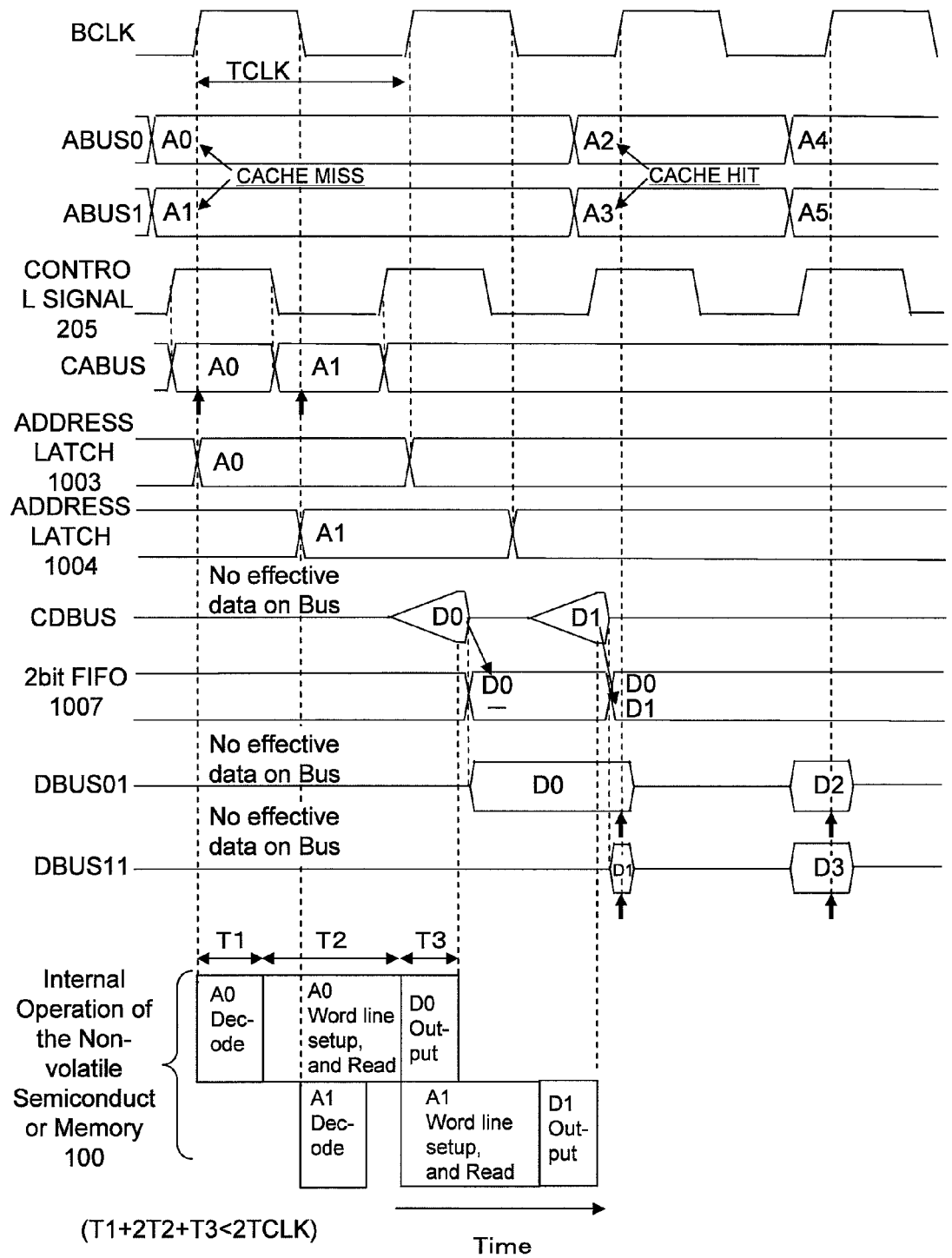
FIG. 14 is an operation timing chart in connection with the important portion of the structure shown in FIG. 13.

FIG. 14 shows the operation timing in connection with the multi processor system shown in FIG. 13.

In the example shown in FIG. 14, the situations in the first to third bus clocks are as follows. In the first bus clock, both the processors CPU0 and CPU1 go into cache miss. Then, these reads are performed on the non-volatile semiconductor memory 100 over 2TCLK. In the third bus clock, cache hits take place for both the addresses A2 and A3. Therefore, as to addresses after the addresses A2 and A3, the address signals are not sent to the non-volatile semiconductor memory 100. If cache miss occurs with the addresses A2 and A3 trailing the addresses A0 and A1, the outputs of the data D2 and D3 will be delayed by 1TCLK in comparison to the example of FIG. 11. However, as N is set to be sufficiently large, the probability of occurrence of such successive cache misses is small. Therefore, it is expected that making N sufficiently larger than M can ease the restriction on the speed of reading the non-volatile semiconductor memory 100, and the performance is not deteriorated to a larger extent in comparison to that achieved in accordance with the seventh embodiment.

That is, The seventh embodiment differs from the sixth embodiment just in that cache memories 501 and 502 are added therein. Therefore, the condition making a restriction on the speed of reading the non-volatile semiconductor memory 100 in accordance with the seventh embodiment is "T1+2T2+T3<2TCLK" and "2T2<TCLK", which is the same as that in the sixth embodiment. However, in the eighth embodiment, such restriction can be eased to just "T1+2T2+T3<2TCLK".

While the invention made by the inventor has been described above specifically, it is not so limited. It is needless to say that various modifications and changes may be made without departing from the subject matter hereof.

In the above description, the application of the invention made by the inventor to a multi processor system, which is an applicable field of the invention, making part of the background hereof, has been chiefly handled. However, the invention is not limited to it, and the invention can be applied to various semiconductor integrated circuit devices widely.

The invention is applicable on condition that such semiconductor integrated circuit devices include at least a non-volatile semiconductor memory.

What is claimed is:

1. A semiconductor integrated circuit device, comprising a non-volatile semiconductor memory accessible for a first CPU and a second CPU different from the first CPU, wherein the non-volatile semiconductor memory includes:
   a plurality of word lines;
   a plurality of bit lines laid out to intersect the plurality of word lines;
   a plurality of non-volatile memory cells connected to the plurality of word and bit lines, and each operable to store data;
   an X decoder for decoding an X address signal transferred from the first or second CPU to form a word line select signal for selecting one of the plurality of word lines;
   a word driver for driving, based on the word line select signal from the X decoder, the corresponding word line to a select level;
   a Y decoder for decoding a Y address signal transferred from the first or second CPU to form a bit line select signal for selecting one of the plurality of bit lines;
   a sense amplifier for amplifying a signal output from the memory cell to the bit line;
   a column multiplexer operable to selectively connect, based on the bit line select signal from the Y decoder, the corresponding bit line to the sense amplifier;
   a output buffer for outputting an output signal of the sense amplifier to the first or second CPU;
   a first latch placed in a post stage subsequent to the X decoder, and operable to hold an output signal of the X decoder and then transfer the signal to the word driver;
   a second latch placed in a post stage subsequent to the Y decoder, and operable to hold an output signal of the Y decoder and then transfer the signal to the column multiplexer; and
   a third latch placed in a post stage subsequent to the sense amplifier, and operable to hold an output signal of the sense amplifier and then transfer the signal to the output buffer.

2. The semiconductor integrated circuit device according to claim 1, wherein an X address signal contained in an address signal transferred from the first or second CPU is decoded into a word line select signal by the X decoder,
   the first latch latches the word line select signal, and
   the word driver drives the word line into the select level in accordance with the word line select signal latched by the first latch.

3. The semiconductor integrated circuit device according to claim 1, wherein a Y address signal contained in an address signal transferred from the first or second CPU is decoded into a bit line select signal by the Y decoder,
   the second latch latches the bit line select signal, and
   the column multiplexer selectively connects, in accordance with the bit line select signal, the corresponding bit line with the sense amplifier.

4. The semiconductor integrated circuit device according to claim 1, wherein a signal output from the non-volatile memory cell to the bit line is amplified by the sense amplifier,
   the third latch latches an output signal of the sense amplifier, and
   the latched signal is output through the output buffer to the first or second CPU.

5. The semiconductor integrated circuit device according to claim 2, wherein an X address signal contained in an address signal transferred from the first CPU is decoded into a word line select signal by the X decoder,
   the first latch latches the word line select signal,
   the word driver drives the word line in accordance with the latched signal, and
   in parallel with driving the word line, the X decoder decodes an X address signal contained in an address signal transferred from the second CPU.

6. The semiconductor integrated circuit device according to claim 3, wherein a Y address signal contained in an address signal transferred from the first CPU is decoded into a bit line select signal by the Y decoder,
   the second latch latches the bit line select signal,
   the column multiplexer selectively connects, in accordance with the bit line select signal, the corresponding bit line with the sense amplifier, and
   in parallel with connecting the bit line with the sense amplifier, a Y address signal contained in an address signal transferred from the second CPU is decoded by the Y decoder.

7. The semiconductor integrated circuit device according to claim 4, wherein data read in accordance with a result of decode of an address signal transferred from the first CPU is latched by the third latch, and then output from the output buffer to the first CPU, and
   in parallel with the data output, a result of decode of an address signal transferred from the second CPU is latched, followed by driving the word line, connecting the bit line with the sense amplifier, and amplifying a signal by use of the sense amplifier.

8. The semiconductor integrated circuit device according to claim 1, wherein the non-volatile semiconductor memory includes:
   a first port which allows an address signal from the first CPU to be latched;
   a first address latch capable of holding the address signal latched through the first port;
   a second port which allows an address signal from the second CPU to be latched;
   a second address latch capable of holding the address signal latched through the second port; and
   a control circuit operable to form a control signal for beginning decode of the address signal held by the second address latch after completion of decode of the address signal held by the first address latch.

9. The semiconductor integrated circuit device according to claim 7, wherein the non-volatile semiconductor memory includes a control circuit for forming control signals for latching a result of decode of an address signal transferred from the second CPU, driving the word line, connecting the bit line with the sense amplifier, and using the sense amplifier to amplify a signal, in parallel with data output from the output buffer to the first CPU after the third latch latches data read in accordance with a result of decode of an address signal transferred from the first CPU.

10. The semiconductor integrated circuit device according to claim 1, wherein the first and second CPUs, and the non-volatile semiconductor memory are formed on a single semiconductor substrate.

11. The semiconductor integrated circuit device according to claim 10, further comprising:
a shared address bus shared by the first and second CPUs; and
an arbiter for arbitrating the right of the first CPU to use the shared address bus, the right of the second CPU to use the shared address bus, and conflict,
the shared address bus and arbiter disposed between the first and second CPUs and the non-volatile semiconductor memory.

12. The semiconductor integrated circuit device according to claim 10, further comprising:
a shared address bus shared by the first and second CPUs and triggered by rising and falling edges of the bus clock signal; and
an address multiplexer for multiplexing address signals output from the first and second CPUs with a frequency identical to a frequency of the bus clock into multiplex signals, and then sending the multiplex signals to the non-volatile semiconductor memory through the shared address bus,
the shared address bus and address multiplexer disposed between the first and second CPUs and the non-volatile semiconductor memory.

13. The semiconductor integrated circuit device according to claim 10, further comprising:
a first data bus for transferring data read out of the non-volatile semiconductor memory to the first CPU; and
a second bus for transferring data read out of the non-volatile semiconductor memory to the second CPU,
wherein data transfer from the non-volatile semiconductor memory to the first CPU and data transfer from the non-volatile semiconductor memory to the second CPU are performed in parallel.

14. The semiconductor integrated circuit device according to claim 13, further comprising:
a first buffer memory disposed between the non-volatile semiconductor memory and first CPU, the first buffer memory operable to sequentially latch and store data output from the non-volatile semiconductor memory, and output the data to the first CPU in order in which the data are latched; and
a second buffer memory disposed between the non-volatile semiconductor memory and second CPU, the second buffer memory operable to sequentially latch data output from the non-volatile semiconductor memory, and output the data to the second CPU in the order in which the data are latched.

15. The semiconductor integrated circuit device according to claim 10, further comprising:
a data bus shared by the first and second CPUs; and
a buffer memory operable to sequentially latch data output through the bus from the non-volatile semiconductor memory, and output the data to the first and second CPUs within a single bus clock in order in which the data are latched.

16. The semiconductor integrated circuit device according to claim 1, wherein the plurality of non-volatile memory cells include: a semiconductor substrate; a memory gate; and a film stack composed of silicon oxide, silicon nitride, and silicon oxide disposed between the substrate and memory gate.

* * * * *